United States Patent
Bobade et al.

(10) Patent No.: US 11,031,237 B2
(45) Date of Patent: Jun. 8, 2021

(54) AROMATIC AMINO SILOXANE FUNCTIONALIZED MATERIALS FOR USE IN CAPPING POROUS DIELECTRICS

(71) Applicant: Merck Patent GmbH, Darmstadt (DE)

(72) Inventors: Sachin Bobade, Sommerville, NJ (US); Orest Polishchuk, Bayonne, NJ (US); Munirathna Padmanaban, Sunnyvale, CA (US); Durairaj Baskaran, Bridgewater, NJ (US)

(73) Assignee: Merck Patent GMbH, Darmstadt (DE)

( * ) Notice: Subject to any disclaimer, the term of this patent is extended or adjusted under 35 U.S.C. 154(b) by 0 days.

(21) Appl. No.: 16/646,224

(22) PCT Filed: Oct. 23, 2018

(86) PCT No.: PCT/EP2018/078940
§ 371 (c)(1),
(2) Date: Mar. 11, 2020

(87) PCT Pub. No.: WO2019/081450
PCT Pub. Date: May 2, 2019

(65) Prior Publication Data
US 2020/0273701 A1    Aug. 27, 2020

Related U.S. Application Data

(60) Provisional application No. 62/576,856, filed on Oct. 25, 2017.

(51) Int. Cl.
*H01L 21/02* (2006.01)
*C07F 7/18* (2006.01)
(Continued)

(52) U.S. Cl.
CPC ...... *H01L 21/02359* (2013.01); *C07F 7/1804* (2013.01); *C23C 16/403* (2013.01);
(Continued)

(58) Field of Classification Search
None
See application file for complete search history.

(56) References Cited

U.S. PATENT DOCUMENTS 4,873,212 A * 10/1989 Stapersma ........... B01J 31/1633
502/158
5,372,930 A * 12/1994 Colton ................... G01Q 60/42
435/6.19

(Continued)

FOREIGN PATENT DOCUMENTS

| KR | 20140046975 A | 4/2014 |
| WO | 2007/143029 A1 | 12/2007 |
| WO | 2014/203067 A1 | 12/2014 |

OTHER PUBLICATIONS

PubChem: "HeptadecyIN-[4-(1,10-phenanthrolin-4-yl)butyl]carbamate", Aug. 20, 2012, pp. 1-8, Retrieved from Internet: URL:https://pubchem.ncbi.nlm.nih.gov/compound/59741863#section=—cited in PCT ISR Feb. 12, 2019.

(Continued)

*Primary Examiner* — Erik Kielin
(74) *Attorney, Agent, or Firm* — Francis M. Houlihan

(57) ABSTRACT

The present invention relates to new aromatic-amino functional siloxanes, which are compounds comprising one or two tail groups $X_2$, and a linking group L of structure (2) linking each said tail group to said head group, wherein the head group X has structure (1), containing an optional organic moiety Y, wherein the attachment point of said tail group $X_2$ through said linking group L to the head group $X_1$, may be, at positions a, b, c, d, or e. Another aspect of this invention are compositions containing these novel aromatic amino functional siloxane. A further aspect of this invention are compositions comprised of the above novel aromatic-amino functional siloxanes, and also the composition result- (Continued)

ing from the aging of these compositions at room temperature for about 1 day to about 4 weeks. Still further aspects of this invention are processes for forming self-assembled monolayers on a substrate, from the aged composition, and also the processes of coating these aged compositions on patterned porous dielectrics to cap them also the processes of metallization of these capped pattered porous dielectrics.

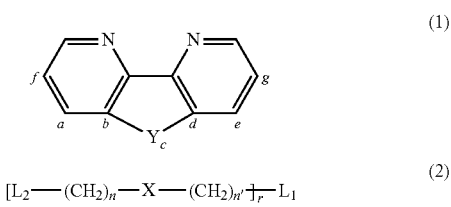

$$[L_2-(CH_2)_n-X-(CH_2)_{n'}]_r-L_1 \quad (2)$$

9 Claims, 4 Drawing Sheets

(51) Int. Cl.
C23C 16/40 (2006.01)
C23C 16/455 (2006.01)
H01L 21/285 (2006.01)
H01L 21/768 (2006.01)
H01L 23/532 (2006.01)

(52) U.S. Cl.
CPC .. *C23C 16/45525* (2013.01); *H01L 21/02164* (2013.01); *H01L 21/02203* (2013.01); *H01L 21/02282* (2013.01); *H01L 21/02362* (2013.01); *H01L 21/28556* (2013.01); *H01L 21/28568* (2013.01); *H01L 21/76877* (2013.01); *H01L 23/5329* (2013.01); *H01L 23/53228* (2013.01)

(56) References Cited

U.S. PATENT DOCUMENTS

2008/0292534 A1* 11/2008 Richardson ........... C01B 11/024
423/477
2013/0276555 A1* 10/2013 Addleman ........ B01L 3/502707
73/864.71

OTHER PUBLICATIONS

Dotsenko, Irina A. et al., "Convenient synthesis of 5-aryl(alkyl)sulfanyl-1,10-phenanthrolines from 5,6-epoxy-5,6-dihydro-1,10-phenanthroline, and their activity towards fungal β-D-glycosidases", Tetrahedron, Elsevier Science Publishers, Amsterdam, NL, vol. 67, No. 39, Jul. 20, 2011—cited in PCT ISR Feb. 12, 2019.
Slough, Greg A., et al., "Synthesis of Readily Cleavable Immobilized 1,10-Phenanthroline Resins", Organic Letters, Vo. 6, No. 17, Aug. 1, 2004—cited in PCT ISR Feb. 12, 2019.
Zhang, Shengbo et al., "Enhanced durability of an iridium-bipyridine complex embedded into organosilica nanotubes for water oxidation", Dalton Transactions, Vo. 46, No. 29, Jul. 5, 2017—cited in PCT ISR Feb. 12, 2019.
Riccardi, Loredana et al., Multifunctional material based on ionic transition metal complexes and gold-silica nanoparticles: Synthesis and photophysical characterization for application in imaging and therapy, Journal of Photochemistry and Photobiology B: Biology, Vo. 140, Nov. 1, 2014, pp. 396-404—cited in PCT ISR Feb. 12, 2019.

Hoogenboom, Richard et al., "Synthesis of an Isocyanate-Functionalized Terpyridine as Building Block for Metallo-Supramolecular Polymers", Synlett, No. 10, Jan. 1, 2004, pp. 1779-1783—cited in PCT ISR Feb. 12, 2019.
Schoffers, Elke et al., "Efficient alcoholysis of 5,6-dihydro-1,10-phenanthroline-5,6-epoxide with ytterbium(III) triflate and subsequent enantioselective transesterification with lipases", Tetrahedron Asymmetry, Pergamon Press Ltd., Oxford, GB, vol. 20, No. 16, Aug. 26, 2009, pp. 1897-1902—cited in PCT ISR Feb. 12, 2019.
Waki, Minoru et al., "A Solid Chelating Ligand: Periodic Mesoporous Organosilica Containing 2,2'-Bipyridine within the Pore Walls", Journal of the American Chemical Society, vol. 136, No. 10., Mar. 12, 2014, pp. 4003-4011—cited in PCT ISR Feb. 12, 2019.
Nguyen, Joseph V. et al., "Design Behavior, and Recycling of Silica-Supported CuBr-Bipyridine ATRP Catalysts", Macromolecules, Vo. 37, No. 4, Feb. 1, 2004, pp. 1190-1203—cited in PCT ISR Feb. 12, 2019.
English Abstract of Publication KR2015-0121395A, Oct. 29, 2015. Note: KR2014-0046975A, Apr. 21, 2014 was cited in PCT ISR dated Feb. 12, 2019.
Mueller, F., et al., "Metal complexes to which an immunologically active material can be or is coupled, and their use", EP0178450A2, Jan. 1, 1986, pp. 1-3, Abstract—cited in PCT ISR Feb. 12, 2019.
Kabehie, Sanaz et al., "Heteroleptic Copper Switches", Journal of the American Chemical Society, vol. 132, No. 45, Nov. 17, 2010, pp. 15987-15996—cited in PCT ISR Feb. 12, 2019.
Armini, S. et al., "Pore Sealing of Porous Ultralow-k Dielectrics by Self-Assembled Monolayers Combined with Atomic Layer Deposition", The Electrochemical Society, ECS Solid State Letters, 1 (2) p. 42-p. 44, Jul. 20, 2012.
Iwasa, Junji, et al., "In Situ Observation of a Self-Assembled Monolayer Formation of Octadecyltrimethoxysilane on a Silicon Oxide Surface Using a High-Speed Atomic Force Microscope", The Journal of Physical Chemistry, C 2016, 120, pp. 2807-2813.
Uedono, Akira, et al., "Surface sealing using self-assembled monolayers and its effect on metal diffusion in porous low-k dielectrics studied using monoenergetic positron beams", Applied Surface Science, 368 (2016), pp. 272-276.
Lionti, K., et al., "Toward Successful Integration of Porous Low-k Materials: Strategies Addressing Plasma Damage", ECS Journal of Solid State Science and Technology, 4 (1) N3072-N3083 (2015).
Goethals, Frederik, et al., "Pore Narrowing of Mesoporous Silica Materials", Materials 2013, 6, 570-579.
Sun, Yiting, et al., "Stuffing-enabled surface confinement of silanes used as sealing agents on CF4 plasma-exposed 2.0 p-OSG films", Microelectronic Engineering 137 (2015) 70-74.
Sun, Yiting et al., Optimization and upscaling of spin coating with organosilane monolayers for low-k pore sealing: Microelectronic Engineering 167 (2017) 32-36.
Golden, Josh H., et al., "Designing Porous Low-k Dielectrics", Semiconductor International; May 2001, 24, 5; ProQuest p. 79-87.
Vanstreels, K, et al., "Mechanical Stability of Porous Low-k Dielectrics", ECS Journal of Solid-State Science and Technology, 4 (1) N3058-N3064 (2015).
Shamiryan, D., "Low-k Dielectric Materials"—Review, Materials Today, Jan. 2004, p. 34.
Tyberg, C. et al., "Porous Low-k Dielectrics: Material Properties", ACS Symposium Series 2004, Chap. 12, pp. 161-171.
International Search Report and Written Opinion, PCT/EP2018/078940, dated Feb. 12, 2019 related to U.S. Appl. No. 16/646,224, filed Mar. 11, 2019.
Sun, Y. et al., "The effect of Ar/H2 plasma pretreatments on porous k=2.0 dielectrics for pore sealing by self-assembled monolayers deposition", Solid State Phenomena, ISSN: 1662-9779, vol. 195, pp. 146-149 (2013).
Volksen, Willi, et al., Low Dielectric Constant Materials, Chem. Rev. 2010, 110, 56-110 Document has been split in 6 parts.

* cited by examiner

US 11,031,237 B2

AROMATIC AMINO SILOXANE FUNCTIONALIZED MATERIALS FOR USE IN CAPPING POROUS DIELECTRICS

This application is a national stage application, filed under 35 U.S.C. § 371, of International Patent Application No. PCT/EP2018/078940, filed on Oct. 23, 2018, which claims the benefit of U.S. Provisional Patent Application No. 62/576,856, filed Oct. 25, 2017, each of which applications is incorporated herein by reference in their entirety.

FIELD OF INVENTION

Spin on capping of Low-κ porous dielectrics

BACKGROUND

Photoresist compositions are used in microlithographic processes for making miniaturized electronic components such as in the fabrication of computer chips and integrated circuits. Generally, in these processes, a thin film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation. This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

The major development in resist products and chemistry has been devoted to the silicon integrated circuit (IC) chip industry. This technology moved from i-line lithography to shorter wave length (deep UV) lithographies, such as 248 nm, 193 nm and 157 nm in quest for higher resolution. Several generations of advanced deep UV resist materials have been developed. Critical dimensions (CD) well below 0.2 μm are achieved in production, applying 248 and 193 nm lithography based on chemically amplified resists.

However, applications, such as processing of GaAs or compound III-V substrates, light emitting diodes (LED), high powered LED and organic light emitting diodes (OLED), on the other hand, largely are still employing conventional i-line lithography and i-line resist materials which are not chemically amplified. For these applications Deposition of metal (a.k.a. metallization) on semiconductor substrates covered with a pattered photoresist is frequently done by chemical vapor deposition (CVD) technologies such as LPCVD. Sputtering metal deposition may also be employed to deposit thick, uniform metal layers. Another technique employed for metallization is Vacuum Deposition (VD), in particular as induced by e-beam (EBPVD).

Electron beam physical vapor deposition, or EBPVD, is a form of physical vapor deposition in which a target anode is bombarded with an electron beam given off by a charged tungsten filament under high vacuum. The electron beam causes atoms from the target to transform into the gaseous phase. These atoms then precipitate into solid form, coating everything in the vacuum chamber (within line of sight) with a thin layer of the anode material.

Sputtering metal deposition is done in a vacuum chamber where an electrically grounded metallic target wafer is bombarded with electrically charged Argon gas, sputtering away the metal atoms and depositing them on a target wafer.

CVD metal deposition occurs by reaction of a reactive gas under reduced pressure with a either the semiconductor substrate, itself or by reaction with a second reactive gas producing in both scenarios a metal deposit. For instance, as non-limiting examples, in the first scenario $WF_6$ may affect deposition on a Silicon substrate by reaction with Si to produce a metallic W deposits and producing as a reaction product gaseous $SiF_6$ which is pumped away. An example of the second scenario is the gaseous reaction of $WF_6$ with $H_2$ to deposit metallic W and producing as a reaction product gaseous HF which is pumped away.

In semiconductor manufacturing, a low-κ is a material with a small dielectric constant relative to bulk non-porous silicon dioxide which has a dielectric constant of 3.9. Low-κ dielectric material implementation is one of several strategies used to allow continued scaling of microelectronic devices, colloquially referred to as extending Moore's law. In digital circuits, insulating dielectrics separate the conducting parts (wire interconnects and transistors) from one another. As components have scaled and transistors have gotten closer together, the insulating dielectrics have thinned to the point where charge build up and crosstalk adversely affect the performance of the device. Replacing the bulk non-porous silicon dioxide with a low-κ dielectric of the same thickness reduces parasitic capacitance, enabling faster switching speeds and lower heat dissipation, specifically, because of this the use a Low-k dielectric in an IC can decrease interconnection delay.

Approaches towards low-k materials include silicon dioxide doped with carbon or fluorine and silicon dioxide and doped silicon dioxide (a.k.a. doped $SiO_2$) and silicon dioxide containing voids (a.k.a. porous $SiO_2$) and the like.

In the selection of appropriate low k-dielectrics a deciding factor is how well these material can be integrated into a particular IC technology node. For instance, one method to deposit the low-k dielectrics is enhanced chemical vapor deposition (PECVD). PECVD has been a workhorse for many years because plasma enhanced chemical vapor deposition (PECVD) shows good compatibility with Ultra Large Scale Integration (ULSI). PECVD can be used to deposit doped silicon dioxides such a silicon dioxide ($SiO_2$), fluorine-doped oxides ($F-SiO_2$), carbon-doped oxides (OSG) which have a k value from about 3.5 and to about 2.4.

Another approach is the introduction of pores in any of the above described materials deposited by CVD processes such as PECVD; this is accomplished by the introduction in this PECVD process of an additional poragen reagent material which will is incorporated into the bulk of the dielectric material, but that can be subsequently be removed by thermal processing, UV exposure, or a combination of thermal and UV processing to create voids in the dielectric material. Voids have a dielectric constant of approximately 1. Consequently, Silicon dioxide and Silicon dioxide doped with other elements, such as carbon, or fluorine, may have their dielectric constant further lowered by the introductions of these voids, increasing their porosity and consequently lowering their dielectric constants.

One specific example of such a method of obtaining a porous dielectric with a k value lower than 2.4 is to use a Carbon-doped silicon oxides which contained poragens may be employed (p-OSG). In this approach the poragens are removed from the OSG by either thermal, or photochemical means to produce additional porosity in the OSG.

However, a drawback in achieving low k dielectrics by increasing porosity, through the introduction of voids, is that the additional porosity created by the voids may affect other properties of the dielectric material which are crucial to IC manufacturing requirements. Examples of such properties are hydrophobicity, chemical stability, mechanical strength, and surface roughness.

Surface roughness of the dielectric may also lead to undesirable metal diffusion into the surface pores of the porous dielectric during metallization processes employed in IC manufacturing. Surface roughness of the dielectric coupled with hydrophilicity may allow moisture to diffuse into the porous dielectric negatively affecting both the low k and uniformity of the dielectric constant in a layer of porous dielectric. Roughness of the dielectric coating and diffusion of metal into the dielectric coating may also negatively affect the performance properties of IC devices incorporating such low k dielectrics.

Consequently, there is a need for novel capping materials which can be used to reduce the surface roughness of porous dielectrics by capping the pores at the surface, and at the same time also preventing diffusion of moisture into the porous dielectric, and also preventing diffusion of metal into the porous dielectric during metallization processes employed in IC manufacturing.

Capping materials for porous dielectrics have been described, but these materials either have poor ability to prevent metal diffusion or may also require the use of gaseous, reagents and water free processing not compatible with conventional spin-coating processing.

Unexpectedly, the applicants have found that a class of novel aromatic-amino functional siloxanes that can be easily be used to coat a porous $SiO_2$ dielectric substrate using a conventional spin coating process to cap the pores in this porous $SiO_2$ dielectric materials, reduce the surface roughness of this material, increase the hydrophobicity of the surface preventing moisture incursion, and which also prevent metal diffusion into the porous dielectric during subsequent metallization processes.

SUMMARY OF THE INVENTION

In one of its aspects, the present invention relates to novel aromatic-amino functional compounds which are compound comprising a head group $X_1$ of structure (1), one or two tail groups $X_2$, and a linking group L, of structure (2), linking each said tail group to said head group.

In said linking group L, $L_1$, attaches it to said head group $X_1$ and is selected from a direct valence bond, —$CH_2$—, —S— and —O—; and within L, $L_2$ is a direct valence bond attaching it to each said tail group $X_2$, and r designates the number of said tail groups $X_2$ attached to said head group $X_1$ through said linking group L and is 1 or 2; X is a direct valence bond or a bivalent moiety selected from the group consisting of —O—, —O—(C=O)—NH—, —NH—(C=O)—O—, —O—(C=O)—O—, —(C=O)—, —O—(C=O)—, —(C=O)—O—, —NH—(C=O)—NH—, —C≡C—, and

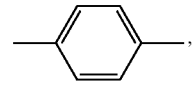

wherein n and n' are integers which independently range from 2 to 8.

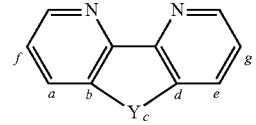 (1)

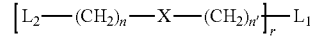 (2)

In structure (1), positions a, b, c, d and e are possible attachment positions of said head group $X_1$ to each said tail group $X_2$, through said linking group L, if these positions are not otherwise occupied by another moiety.

Y, in structure (1), is an optional bivalent organic moiety attaching positions b and d of structure (1), which forms a two carbon link containing either a single or double carbon to carbon bond. The two carbon positions on this linkage may be independently further substituted with hydrogen, an alkyl group, or an aryl group. Alternatively, the two carbon positions on this linkage may also be substituted in such a manner to be further joined together through a six membered saturated, or aromatic ring moiety. Furthermore, the linkage itself, its substituents, or any ring moieties joining the two positions in Y, may be potential attachment points linking of said head group $X_1$ to each said group $X_2$ through said linking group L.

If bivalent organic moiety Y is present, positions a, c, and e, if not otherwise substituted, are possible attachment position of said head group $X_1$ to each said tail group $X_2$, through said linking group L, or otherwise may be independently substituted by hydrogen, an alkyl moiety, or an aryl moiety, or where positions a and f or e and g are substituted in a manner further joining them together through a six membered saturated or aromatic ring moiety. If not part of said six membered ring system, positions e and g, in structure (1), may be independently substituted by hydrogen, an alkyl moiety, or an aryl moiety.

If bivalent organic moiety Y is absent, positions a, b, d, e, if not otherwise substituted, are possible attachment position of said head group $X_1$ to each said tail group $X_2$ through said linking group L. Alternatively, these position may be independently substituted by hydrogen, an alkyl moiety or an aryl moiety. Also, positions, a and b, a and f, d and e, or e and g may be substituted in a manner to further join them together through a six membered saturated, or aromatic ring moiety. If not part of said six membered ring system, positions e and g in structure (1) are independently substituted by hydrogen, an alkyl moiety, or an aryl moiety.

Finally, $X_2$ is selected from the group consisting of, a moiety comprising a trialkyloxysilane group, a moiety comprising a dialkyloxysilane moiety group, a moiety comprising a monoalkyloxysilane; a moiety comprising a monoalkyloxyalkylsilane; a moiety comprising a monoalkyloxydialkylsilane; and a moiety comprising a dialkyloxymonoalkylsilane.

Another aspect of this invention are compositions containing these novel aromatic amino functional siloxane, another aspect in the process for self-assembled monolayers of aromatic-amino functional siloxane.

A further aspect of this invention are compositions comprised of the above novel compounds, and also the composition resulting from the aging of these compositions at room temperature for—about 1 day to about 4 weeks. In another aspect of this embodiment the aging is done for about 1 days to about 3 weeks. In another aspect of this embodiment the aging is done for about 2 days to about 3 weeks. In another aspect of this embodiment the aging is done for about 2 days to about 4 weeks.

Still further aspects of this invention are processes for forming self-assembled monolayers on a substrate, from the aged composition, and also the processes of coating these aged compositions on patterned porous dielectrics to cap them also the processes of metallization of these capped patterned porous dielectrics.

BRIEF DESCRIPTION OF THE DRAWINGS

FIG. 1 1H NMR spectrum of (8-bromooctyl)triethoxysilane.

DETAILED DESCRIPTION

Figure 1:
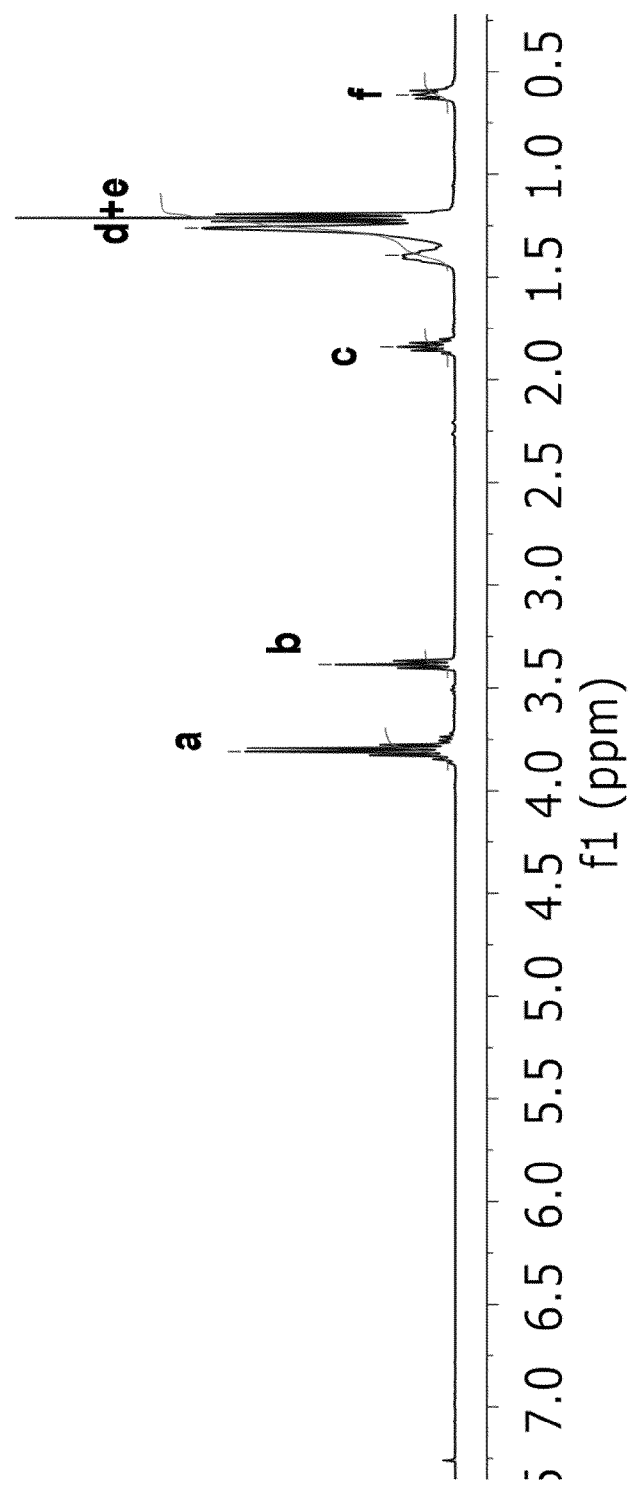

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Herein, unless otherwise indicated, the term "bivalent," is synonymous with "divalent," and refers to a moiety organic or inorganic which has two attachment points. Similarly, the term "trivalent," refers to an organic or inorganic moiety which has three attachment point.

Herein, unless otherwise indicated, the term "bifunctional," is synonymous with "difunctional," and refers to a molecule or compound which has two of a given type of reactive functional groups. As a non-limiting examples, in some embodiments of the applicant's invention some of the described molecules have two trialkyloxysilyl moieties, and would be termed a difunctional molecule with respect to this reactive functional group.

Herein, unless otherwise indicated, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamantly and the like). These alkyl moieties may be substituted or unsubstituted as described below. The term alkyl refers to such moieties with C-1 to C-20 carbons. It is understood that for structural reasons linear alkyls start with C-1, while branched alkyls and linear start with C-3 and multicyclic alkyls start with C-5. Moreover, it is further understood that moieties derived from alkyls described below such as alkyloxy, haloalkyloxy have the same carbon number ranges unless otherwise indicated.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br, I which is linked by one bond to an organic moiety.

Haloalkyl refers to a linear, cyclic or branched saturated alkyl group such as defined above in which at least one of the hydrogens has been replaced by a halide selected from the group consisting of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g. trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g. trifluoromethyoxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range carbon atoms which starts with C-1 such as for instance "C-1 to C-20 alkyl," or "C-1 to C-20 fluoroalkyl," as a non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term alkylene refers to hydrocarbon groups which can be a linear, branched or cyclic which has two (a.k.a. bivalent) or more (a.k.a. trivalent and higher) attachment points (e.g. of two attachment points: methylene, ethylene, 1,2-isopropylene, a 1,4-cyclohexylene and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

Herein the term Aryl or aromatic groups refers to such groups which contain 6 to 24 carbon atoms including phenyl, tolyl, xylyl, naphthyl, anthracyl, biphenyls, bisphenyls, tris-phenyls and the like. These aryl groups may further be substituted with any of the appropriate substituents e.g. alkyl, alkoxy, acyl or aryl groups mentioned hereinabove.

Herein the term arylene refers to a aromatic hydrocarbon moiety which has two or more attachment points (e.g. 2-5), this moiety may be a single benzene moiety (e.g. 1,4-phenylene, 1,3-phenylene and 1,2-phenylene), a polycyclic aromatic moiety with two attachment points such derived from napthalene, anthracene, pyrene and the like, or a multiple benzene rings in a chain which have two attachment point (e.g. biphenylene). In those instance where the aromatic moiety is a fused aromatic ring, these may be called fused ring arylenes, and more specifically named, for instance, napthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5-10 carbon atoms.

Herein the term fused aromatic ring refers to a carbon based polycyclic aromatic compound containing 2-8 carbon based aromatic rings fused together (e.g. naphthalene, anthracene, and the like) these fused aromatic ring which may have a single attachment point to an organic moiety as part of an aryl moiety such as a pendant fused aromatic ring aryl group on a polymer or have two attachment points as part of an arylene moiety, such as, for instance, in the backbone of a polymer.

Unless otherwise indicated in the text, the term "substituted" when referring to an aryl, alkyl, alkyloxy, fluoroalkyl, fluoroalkyloxy or fused aromatic ring refers to one of these moieties which also contain with one or more substituents, selected from the group consisting of unsubstituted alkyl, substituted alkyl, unsubstituted aryl, substituted aryl, alkyloxy, alkylaryl, haloalkyl, halide, hydroxyl, amino and amino alkyl. Similarly, the term "unsubstituted" refers to these same moieties wherein no substituents apart from hydrogen is present.

Unless otherwise indicated, the term "high carbon polymer," or "high carbon polymer component," refers to the polymer component of the inventive compositions which is comprised of repeat units having structure (1), (2) and (3) in all its embodiments as described below, unless otherwise indicated.

Novel Aromatic-Amino Functional Siloxanes

In one of its aspects, the present invention relates to novel aromatic-amino functional compounds which are compound comprising a head group $X_1$ of structure (1), one or two tail groups $X_2$, and a linking group L, of structure (2), linking each said tail group to said head group.

In said linking group L, $L_1$, attaches it to said head group $X_1$ and is selected from a direct valence bond, —$CH_2$—, —S— and —O—; and within L, $L_2$ is a direct valence bond attaching it to each said tail group $X_2$, and r designates the number of said tail groups $X_2$ attached to said head group $X_1$ through said linking group L and is 1 or 2; X is a direct valence bond or a bivalent moiety selected from the group consisting of —O—, —O—(C=O)—NH—, —NH—(C=O)—O—, —O—(C=O)—O—, —(C=O)—, —O—(C=O)—, —(C=O)—O—, —NH—(C=O)—NH—, —C≡C—, and

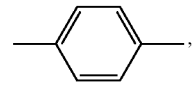

wherein n and n' are integers which independently range from 2 to 8.

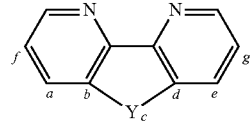 (1)

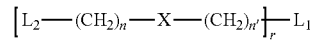 (2)

In structure (1), positions a, b, c, d and e are possible attachment positions of said head group $X_1$ to each said tail group $X_2$, through said linking group L, if these positions are not otherwise occupied by another moiety.

Y, in structure (1), is an optional bivalent organic moiety attaching positions b and d of structure (1), which forms a two carbon link containing either a single or double carbon to carbon bond. The two carbon positions on this linkage may be independently further substituted with hydrogen, an alkyl group, or an aryl group. Alternatively, the two carbon positions on this linkage may also be substituted in such a manner to be further joined together through a six membered saturated, or aromatic ring moiety. Furthermore, the linkage itself, its substituents, or any ring moieties joining the two positions in Y, may be potential attachment points linking of said head group $X_1$ to each said group $X_2$ through said linking group L.

If bivalent organic moiety Y is present, positions a, c, and e, if not otherwise substituted, are possible attachment position of said head group $X_1$ to each said tail group $X_2$, through said linking group L, or otherwise may be independently substituted by hydrogen, an alkyl moiety, or an aryl moiety, or where positions a and f or e and g are substituted in a manner further joining them together through a six membered saturated or aromatic ring moiety. If not part of said six membered ring system, positions e and g, in structure (1), may be independently substituted by hydrogen, an alkyl moiety, or an aryl moiety.

If bivalent organic moiety Y is absent, positions a, b, d, e, if not otherwise substituted, are possible attachment position of said head group $X_1$ to each said tail group $X_2$ through said linking group L. Alternatively, these position may be independently substituted by hydrogen, an alkyl moiety or an aryl moiety. Also, positions, a and b, a and f, d and e, or e and g may be substituted in a manner further to join them together through a six membered saturated, or aromatic ring moiety. If not part of said six membered ring system, positions e and g in structure (1) are independently substituted by hydrogen, an alkyl moiety, or an aryl moiety.

Finally, $X_2$ is selected from the group consisting of, a moiety comprising a trialkyloxysilane group, a moiety comprising a dialkyloxysilane moiety group, a moiety comprising a monoalkyloxysilane; a moiety comprising a monoalkyloxyalkylsilane; a moiety comprising a monoalkyloxydialkylsilane; and a moiety comprising a dialkyloxymonoalkylsilane.

Another aspect of the above novel aromatic-amino functional siloxanes is one wherein said head group $X_1$ is selected from the group consisting and a 1,10 phenanthroline derivative group and a 2,2'-bipyridine derivative group.

In another aspect of the above novel aromatic-amino functional siloxanes is one wherein said head group $X_1$ is a 1,10 phenanthroline derivative group.

In another aspect of the above novel aromatic-amino functional siloxanes is one wherein said head group $X_1$ is a 2,2'-bipyridine derivative group.

In another aspect of the above novel aromatic-amino functional siloxanes is one wherein said r is 1.

In another aspect of the above novel aromatic-amino functional siloxanes is one wherein said r is 2.

Another aspect of any of the above novel aromatic-amino functional siloxanes is one wherein, in structure (2), n ranges from 3 to 8. In another aspect, this embodiment is one wherein n' ranges from. Another aspect, this embodiment is one wherein n ranges from 4 to 8. In another aspect, this embodiment is one wherein n' ranges from 2 to 6. In another aspect, this embodiment is one wherein n ranges from 5 to 8. In another aspect, this embodiment is one wherein n' ranges from 2 to 5. In another aspect, this embodiment is one wherein n ranges from 6 to 8. In another aspect, this embodiment is one wherein n' ranges from 3 to 5. In another aspect, this embodiment is one wherein n ranges from 7 to 8. In another aspect, this embodiment is one wherein n' ranges from 4 to 5. In another aspect, this embodiment is one wherein n is 8. In another aspect, this embodiment is one wherein n' is 4.

In another embodiment of the above novel aromatic-amino functional siloxane compounds in structure (2) $L_1$ is —$CH_2$— or —S—. In another, $L_1$ is —$CH_2$— or —O—. In another $L_1$ is a direct valence bond or —O—. In yet another, $L_1$ is a direct valence bond or —S—. In still another, $L_1$ is a direct valence bond or —$CH_2$—. In yet another $L_1$ is a direct valence bond. In yet another $L_1$ is —$CH_2$—. In yet another, $L_1$ is —O—. In a final embodiment of this aspect of the inventive compound $L_1$ is —S—.

In another aspect, this embodiment is one wherein X is a direct valence bond or a bivalent moiety selected from the group consisting of —O—, —O—(C=O)—NH—, —NH—(C=O)—O—, —O—(C=O)—O—, —(C=O)—, —O—(C=O)—, —(C=O)—O—, and —NH—(C=O)—NH—. In another aspect, this embodiment is one wherein X is a direct valence bond or a bivalent moiety selected from the group consisting of —O—, —O—(C=O)—NH—, —NH—(C=O)—O—, and —O—(C=O)—O—. In another, this embodiment is one wherein X is a direct valence bond or a bivalent moiety selected from the group consisting of —O—(C=O)—NH—, —NH—(C=O)—O—, and —O—(C=O)—O—. In another aspect, this embodiment is one wherein X is a direct valence bond or a bivalent moiety selected from the group consisting of —O—(C=O)—NH—, —NH—(C=O)—O—, and —O—(C=O)—O—. In another aspect, this embodiment is one wherein X is a direct valence bond or the bivalent moiety —O—(C=O)—NH—.

In another aspect, this embodiment is one wherein X is a direct valence bond.

In another aspect, this embodiment is one wherein X is the bivalent moiety —O—(C=O)—NH—.

In another aspect of any of the above embodiment, said tail group $X_2$ is a moiety comprising a trialkyloxysilane group. Another aspect, of the above, is one wherein said tail group $X_2$ is a moiety comprising a dialkyloxysilane group. Another aspect, of any of the above, is one wherein said tail group $X_2$ is a moiety comprising a monoalkyloxysilane group. In another aspect, of any of the above, is one is one wherein said tail group $X_2$ is a moiety comprising a monoalkyloxydialkylsilane group. In another aspect, this embodiment is one wherein said tail group $X_2$ is moiety comprising a dialkyloxymonoalkylsilane group. In another aspect, this embodiment is one wherein bivalent organic moiety Y is present and is comprised of a two carbon alkylene moiety. In another aspect, this embodiment is one wherein bivalent organic moiety Y is present and comprised of a two carbon alkenylene moiety. In another aspect, this embodiment is one wherein bivalent organic moiety Y is present is comprised of an arylene moiety which is attached through two adjacent vicinal ring carbons of the arylene.

In another aspect, this embodiment is one wherein one said tail group $X_2$ through said linking group L is attached to said head group $X_1$.

Another aspect of the above novel aromatic-amino functional siloxanes is one wherein, two said tail groups $X_2$, each are individually attached through said linking group L, to said head group $X_1$.

Another aspect of the above novel aromatic-amino functional siloxanes is one where the above compounds have the more specific structure (1a), wherein $X_{1a}$ is a head group selected from the group consisting of (3), (3a) and (3b); $X_{2a}$ is a tail group selected from the group consisting of (4), and (4a); ∿∿∿ represents a point of attachment; Q and $Q_1$ are independently selected from hydrogen or $C_1$ to $C_6$ to alkyl group; wherein m is a integer ranging from 2 to 8, r' is the number of tail groups attached to the head group, r' is 1 if the head group $X_{1a}$ is selected from (3) or (3b), and r' is 2 if the head group $X_{1a}$ is (3a), and m1 and m2 are integers independently ranging from 2 to 8; y and y1 independently are 0, 1 or 2; and further wherein R and $R_1$ are independently selected from a $C_1$ to $C_6$ alkyl group;

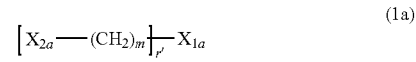

(1a)

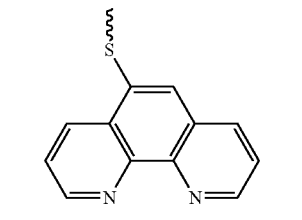

(3)

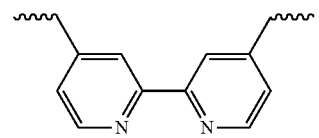

(3a)

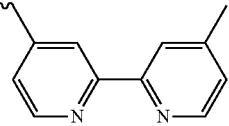

(3b)

-continued

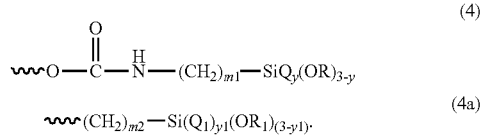

(4)

(4a)

Another aspect of the above novel aromatic-amino functional siloxanes having structure (1a) is one wherein m ranges from 3 to 8. In yet another, m ranges from 4 to 8. In another, m ranges from 5 to 8. In still another, m ranges from 6 to 8. In yet another, m ranges from 7 to 8. In a final embodiment of this aspect of the inventive compound in structure (1a) m is 8.

In another embodiment of the inventive compound having structure (1a) the tail group $X_{2a}$ has structure (4), m1 ranges from 2 to 7. In yet another, m1 ranges from 2 to 6. In still another, m1 ranges from 2 to 5. In yet another, m1 ranges from 2 to 4. In still another, m1 ranges from 3 to 4. In a final embodiment of this aspect of the inventive compound in the tail group of structure (4) m1 is 4.

In another embodiment of the inventive compound having structure (1a) the tail group $X_{2a}$ has structure (4a), m2 ranges from 2 to 7. In yet another, m2 ranges from 2 to 6. In still another, m2 ranges from 2 to 5. In yet another, m2 ranges from 2 to 4. In still another, m2 ranges from 3 to 4. In a final embodiment of this aspect of the inventive compound in the tail group of structure (4a) m2 is 4.

Another aspect of the above novel aromatic-amino functional siloxanes having more specific structure (1a) is one wherein the head group has structure (3).

Another aspect of the above novel aromatic-amino functional siloxanes having more specific structure (1a) is one wherein the head group has structure (3a).

Another aspect of the above novel aromatic-amino functional siloxanes having more specific structure (1a) is one wherein the head group has structure (3b).

Another aspect of the above novel aromatic-amino functional siloxanes having more specific structure (1a) is one wherein the tail group has structure (4). Another aspect of this aspect is one wherein in structure (4), y is 0, another where y is 1, another where y is 2.

Another aspect of the above novel aromatic-amino functional siloxanes having more specific structure (1a) is one wherein the tail group has structure wherein the tail group has structure (4a). Another aspect of this aspect is one wherein in structure (4a), y1 is 0, another where y1 is 1, another where y1 is 2.

Another aspect of the above novel aromatic-amino functional siloxanes having more specific structure (1a) is one wherein the tail group has structure (4) and where Q is hydrogen and R is methyl, ethyl or propyl, in another where Q is hydrogen and R is methyl or ethyl, in another where Q is hydrogen and R is ethyl.

Another aspect of the above novel aromatic-amino functional siloxanes having more specific structure (1a) is one wherein the tail group has structure (4) and where Q is methyl and R is methyl, ethyl or propyl, in another where Q is methyl and R is methyl or ethyl, in another where Q is methyl and R is ethyl.

Another aspect of the above novel aromatic-amino functional siloxanes having more specific structure (1a) is one wherein the tail group has structure (4a) and where $Q_1$ is hydrogen and $R_1$ is methyl, ethyl or propyl, in another where $Q_1$ is hydrogen and $R_1$ is methyl or ethyl, in another where $Q_1$ is hydrogen and $R_1$ is ethyl.

Another aspect of the above novel aromatic-amino functional siloxanes having more specific structure (1a) is one wherein the tail group has structure (4a) and where $Q_1$ is methyl and $R_1$ is methyl, ethyl or propyl, in another where $Q_1$ is methyl and $R_1$ is methyl or ethyl, in another where $Q_1$ is methyl and $R_1$ is ethyl.

More specific non limiting examples of the above described embodiment of novel aromatic amino functionalized siloxanes are shown in structures (5) to (53) as follows:

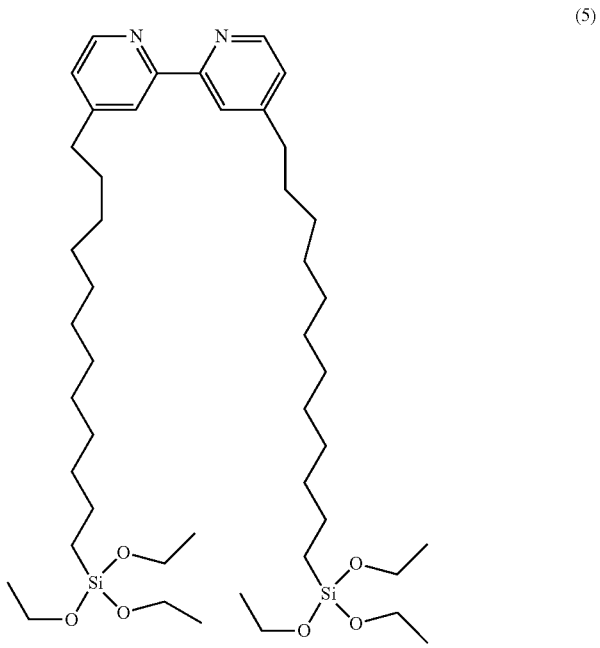

(5)

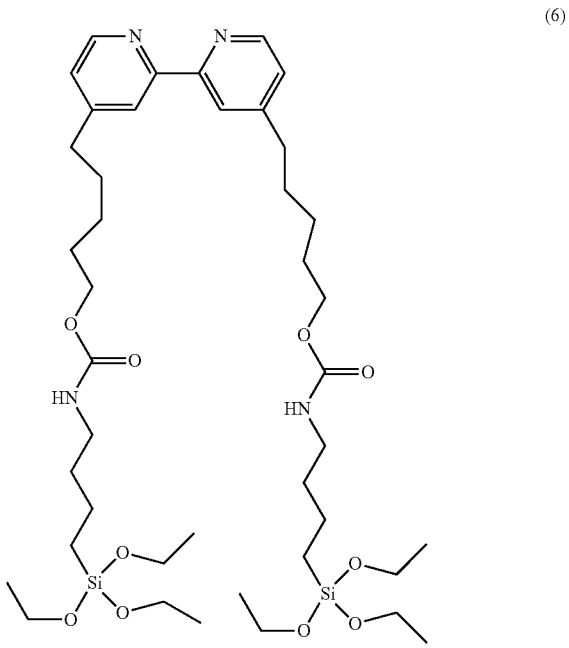

(6)

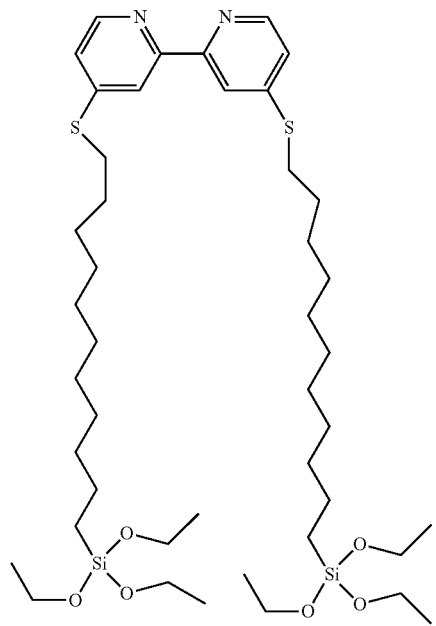
(7)
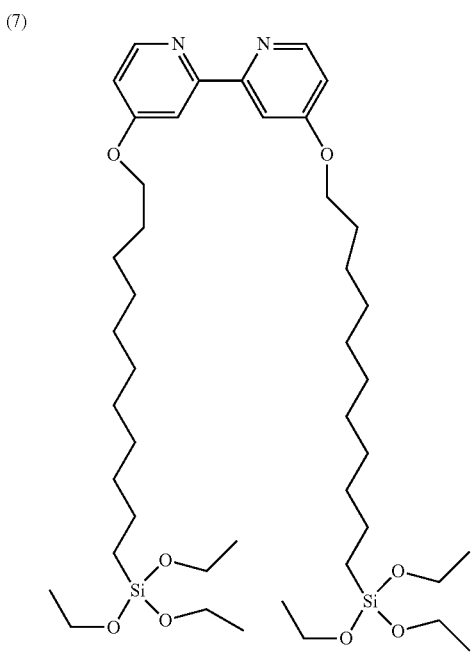
(8)
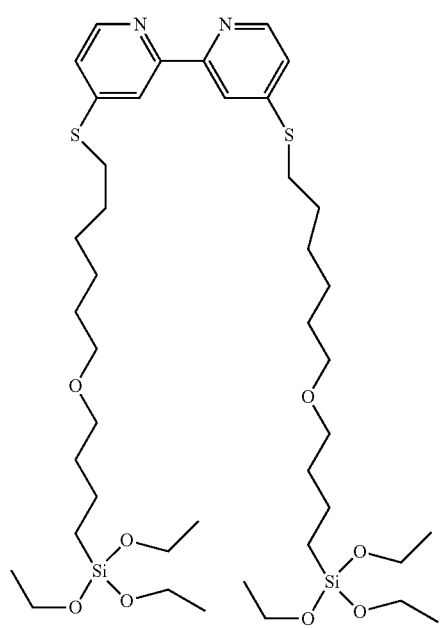
(9)
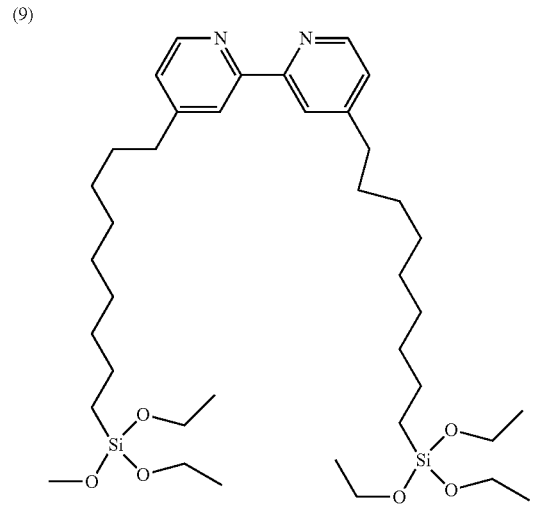
(10)

-continued
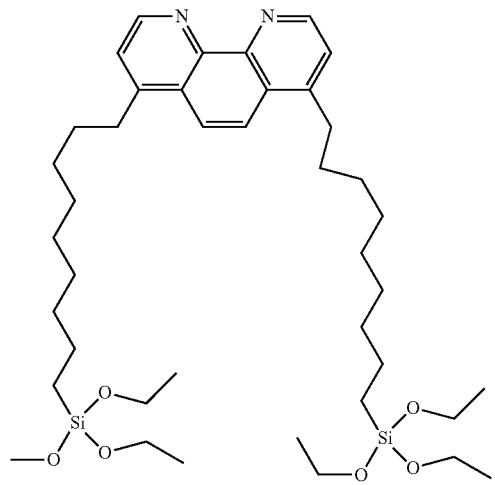
(11)
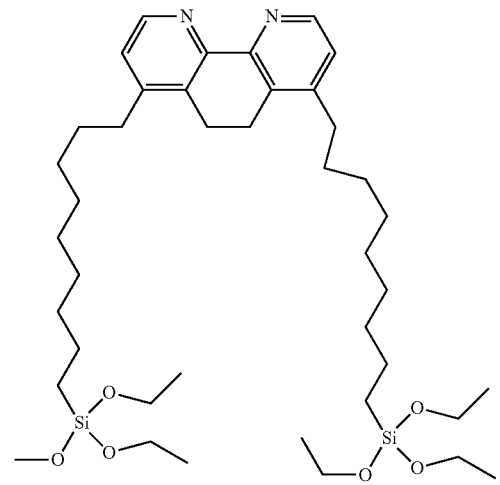
(12)
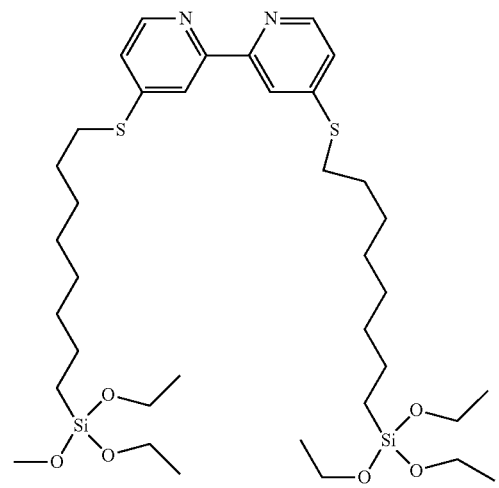
(13)
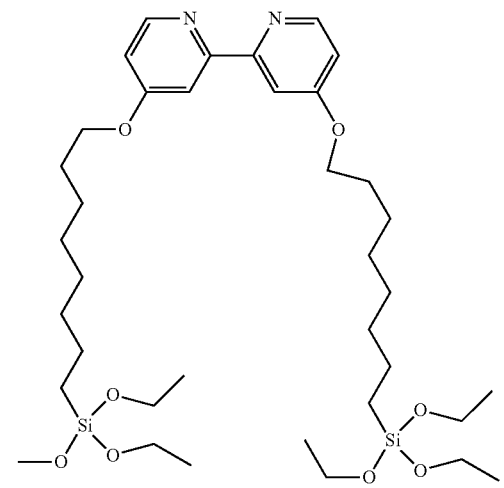
(14)
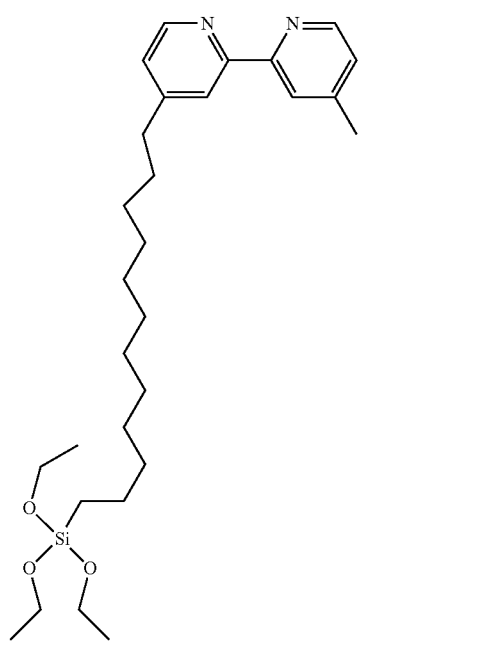
(15)
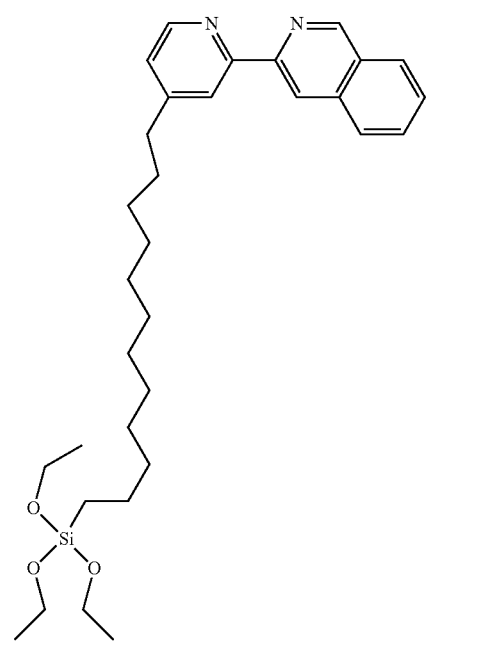
(16)

-continued
(17)
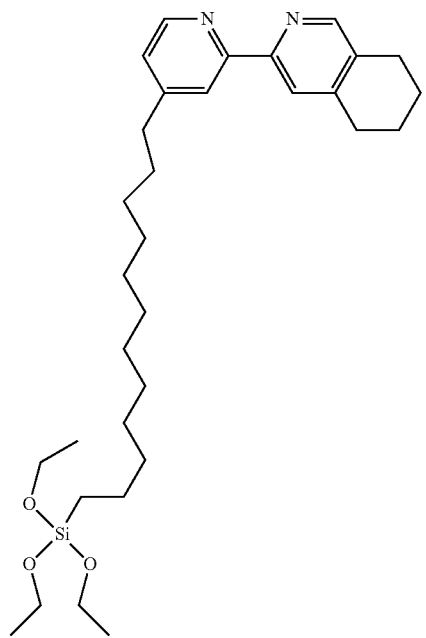
(18)
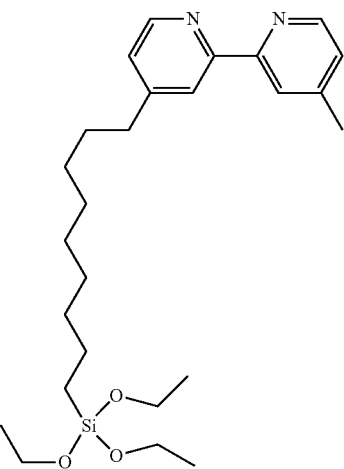
(19)
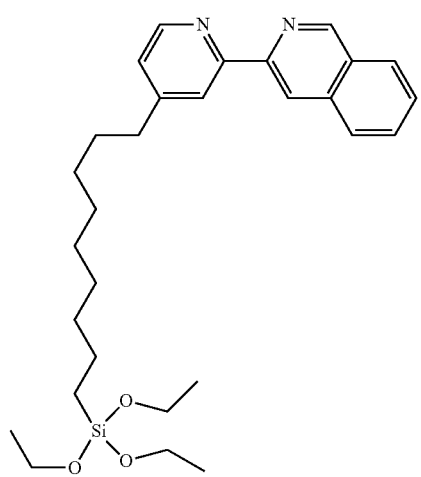
(20)
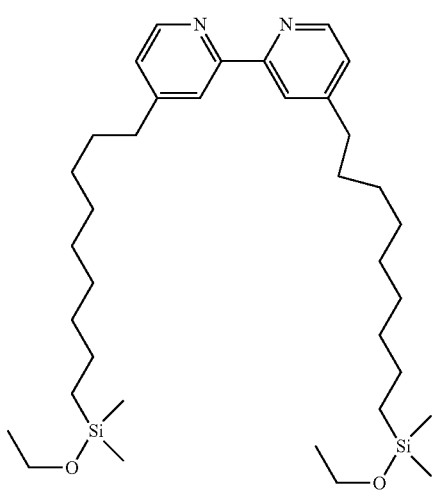

-continued
(21)
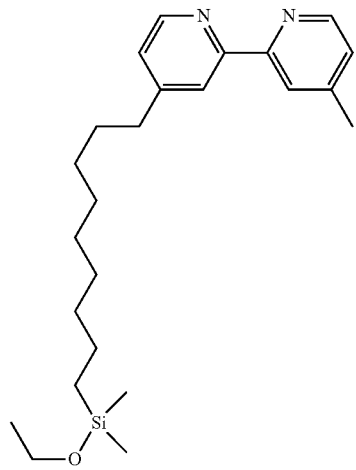
(22)
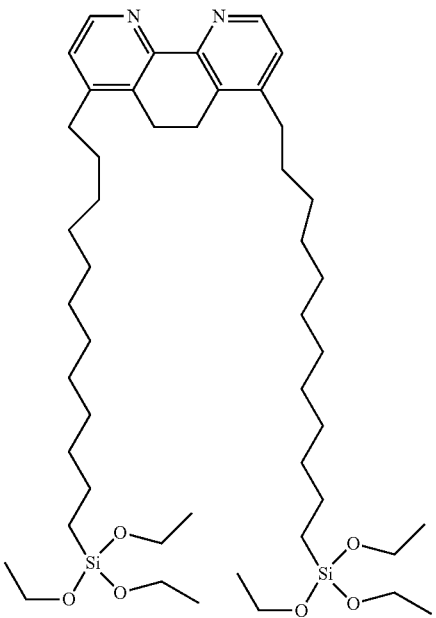
(23)
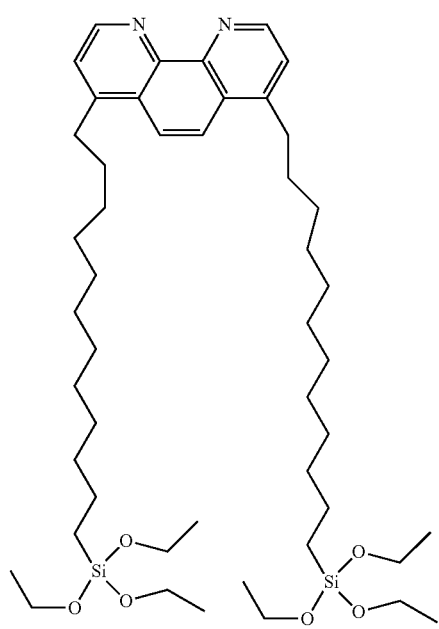
(24)
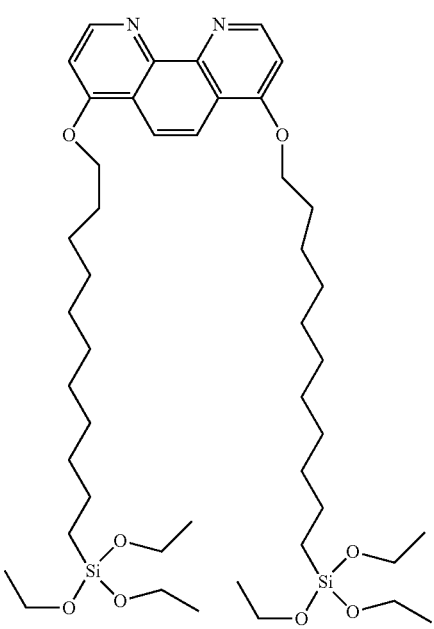

-continued
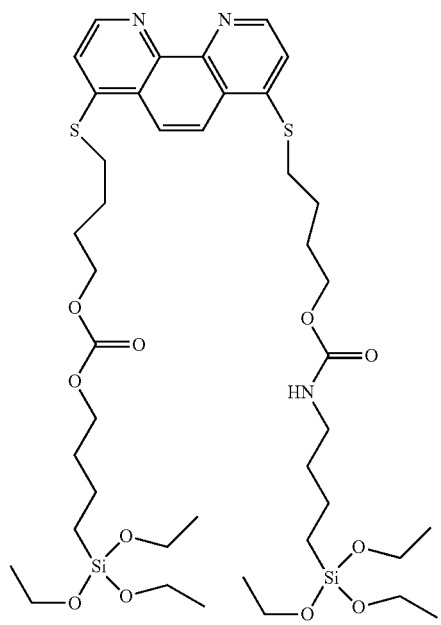
(25)
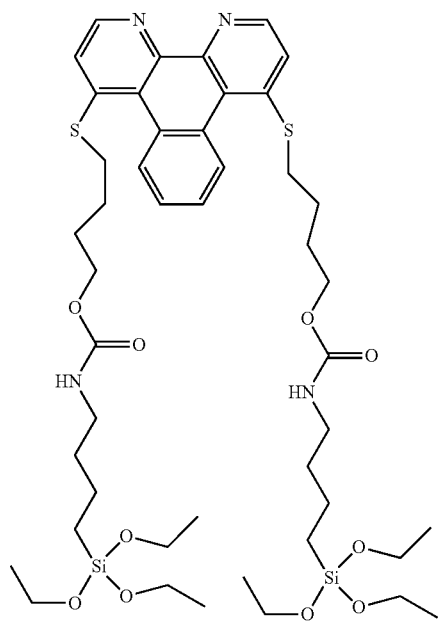
(26)
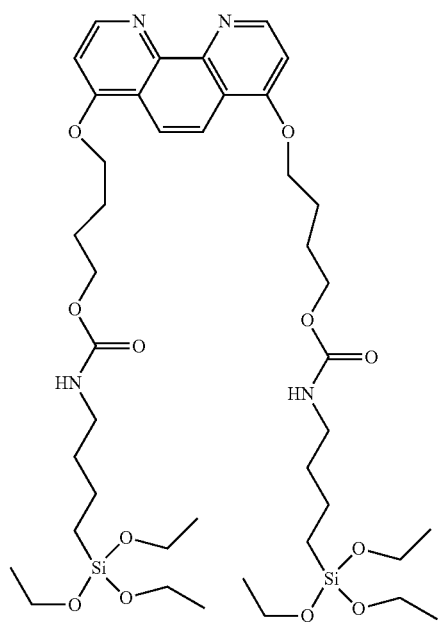
(27)
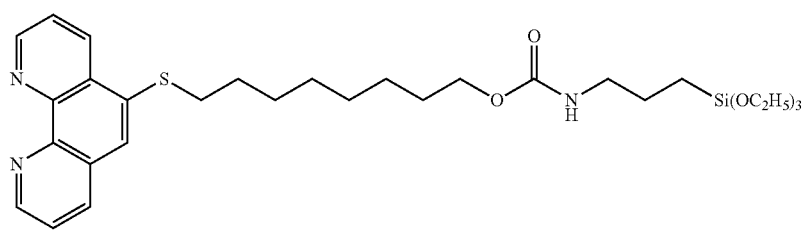
(28)

-continued
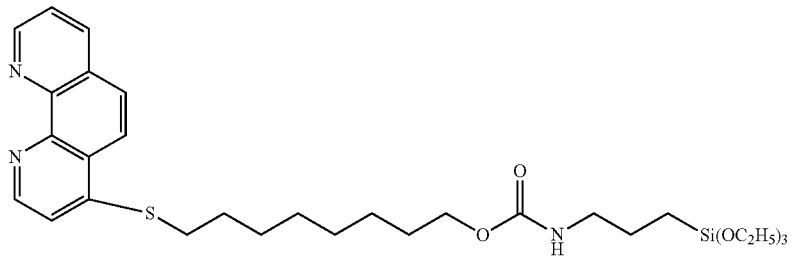
(29)
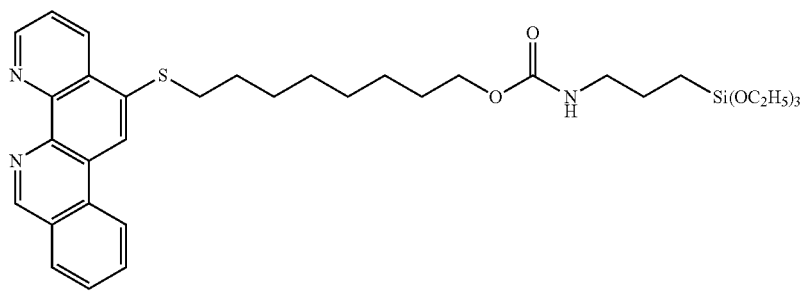
(30)
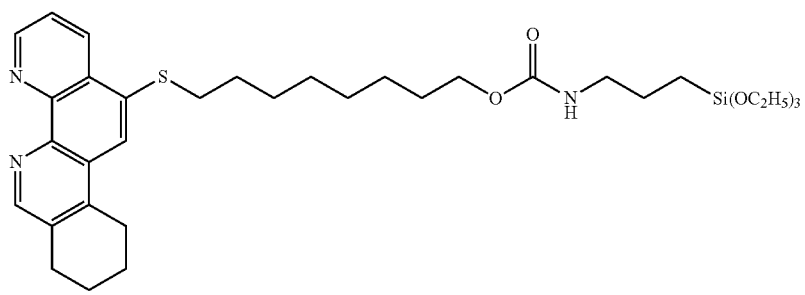
(31)
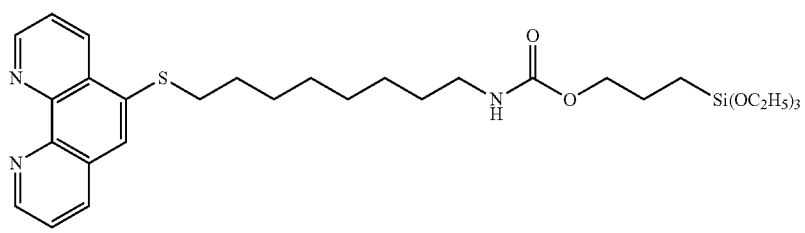
(32)
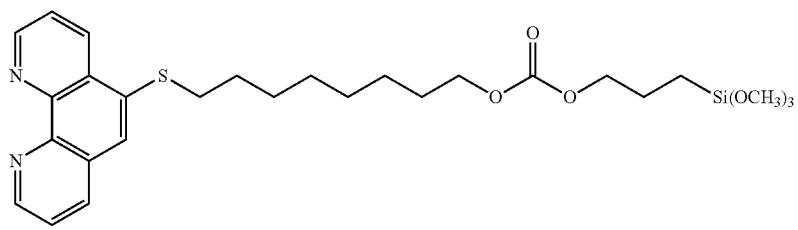
(33)
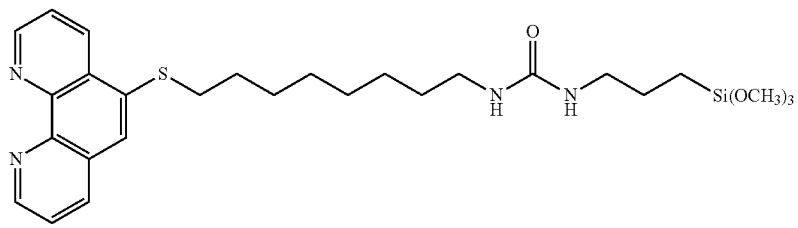
(34)

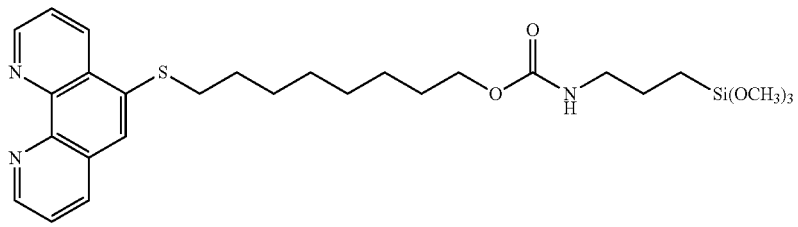
(35)
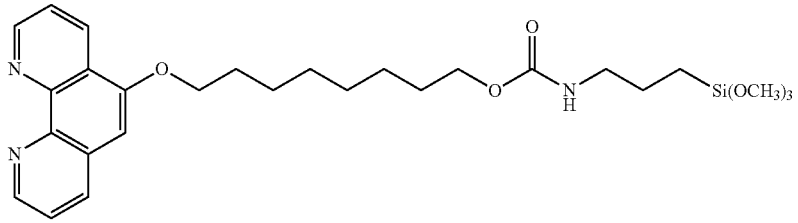
(36)
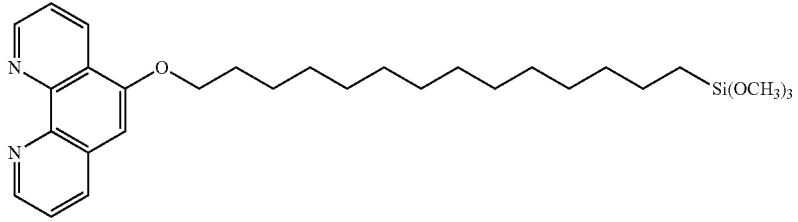
(37)
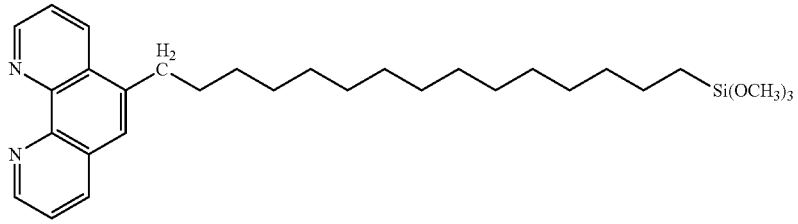
(38)
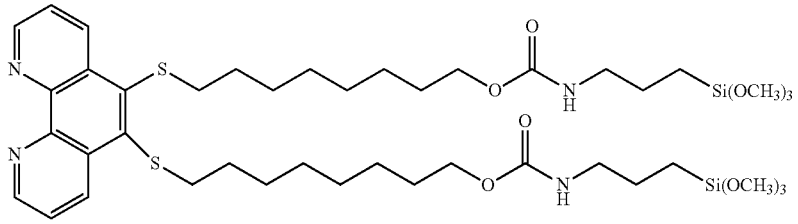
(39)
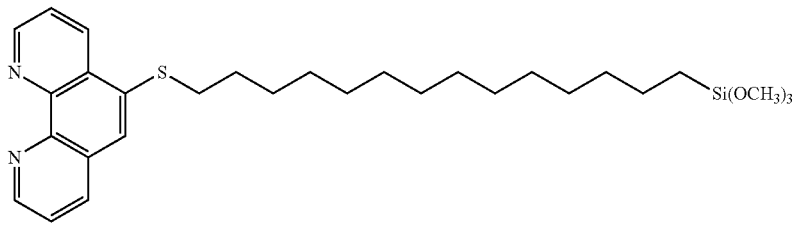
(40)

-continued
(41)
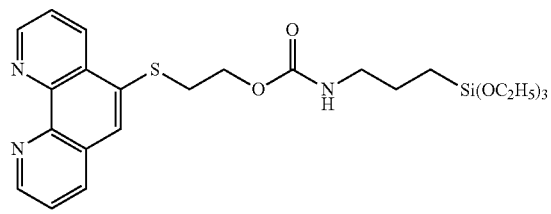
(42)
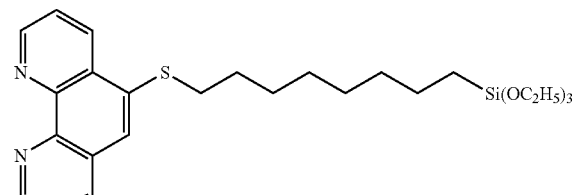
(43)
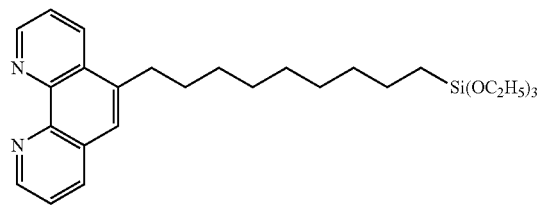
(44)
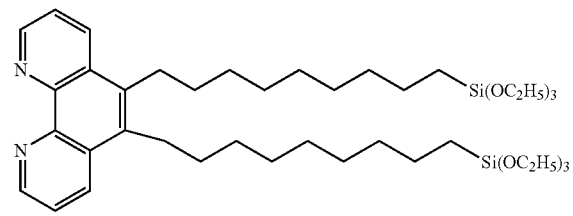
(45)
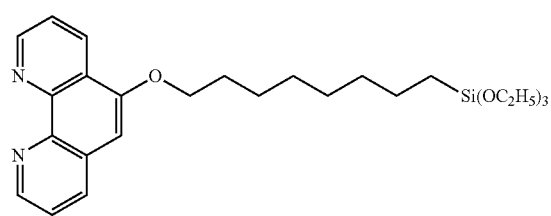
(46)
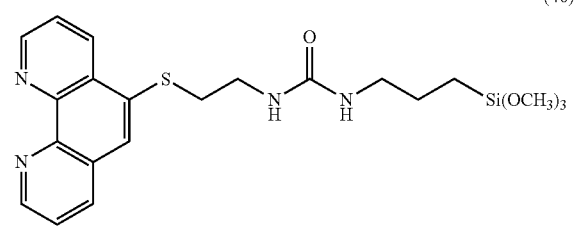
(47)
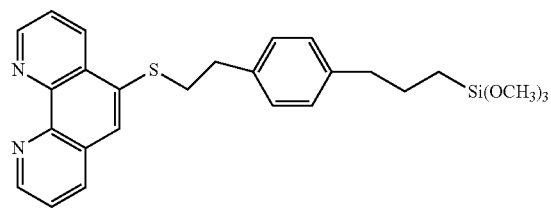
(48)
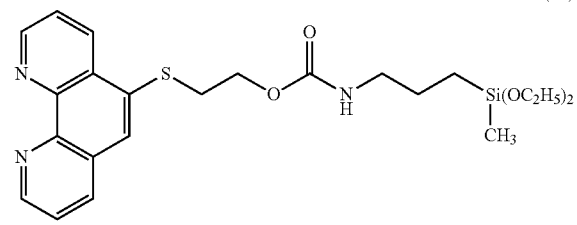
(49)
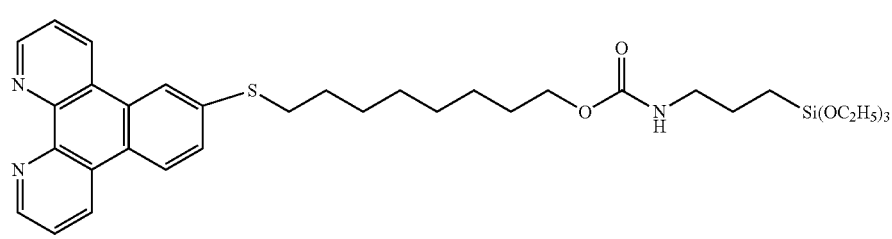
(50)
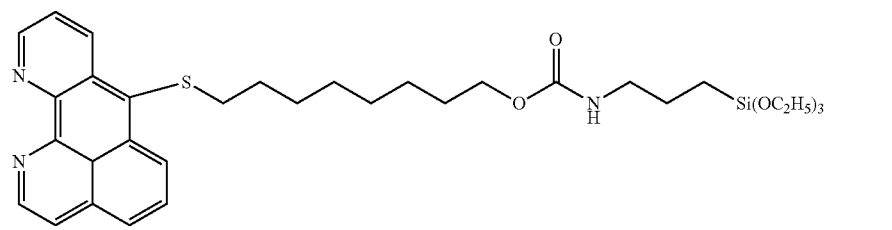
(51)
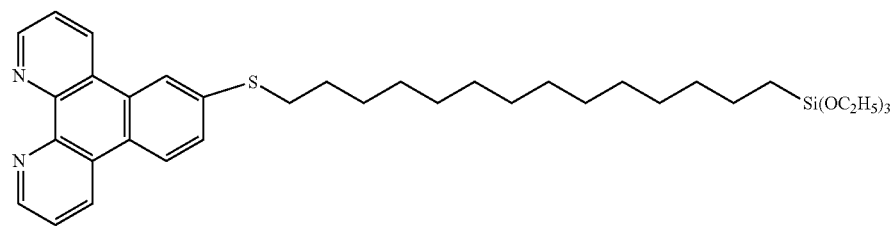

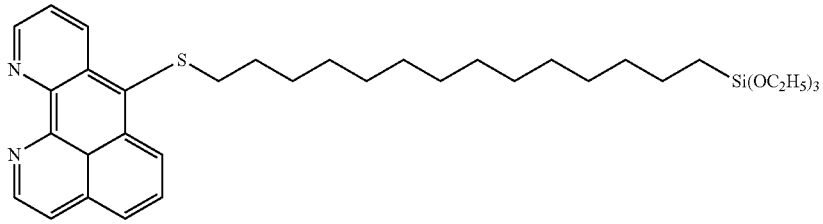

(52)

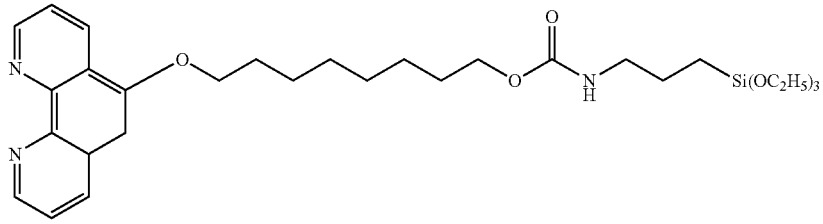

(53)

Although not bound by theory it is believed that the relationship between Pore sizes of porous $SiO_2$ and the Dimensions of Novel Aromatic Amino Functional Siloxanes and spacer lengths therein preferred in the process of capping pores as the surface of the porous dielectrics are as follows:

In one embodiment of the above described Novel Aromatic Amino Functional Siloxanes, preferred ones are one which have a molecular volume ranging from about 350 cubic Å to about 580 cubic Å. In another preferred embodiment this range is about 420 cubic Å to about 570 cubic Å. For bifunctional aromatic functional siloxanes containing two siloxanes tethered to an aromatic amino moiety through a spacer group, the volume calculated these ranges is half the actual volume. Non Limiting Examples of such bifunctional materials are shown in structures (5)-(12), (13), (14), (22)-(27), ($C_9$DBSI) and (C12DBSi). Although not bound by theory it is believed that these molecular volumes are particularly preferred for capping pore sizes in porous $SiO_2$ which have a diameter from about 10 to about 20 Å.

In another embodiment of the above described Novel Aromatic Amino Functional Siloxanes, preferred ones are one which have a molecular length ranging from about 13 Å to about 30 cubic Å. In another embodiment it is particularly preferred if this range is about 14.7 Å to about 28.1 Å. Again, for bifunctional aromatic functional siloxanes containing two siloxanes teetered to an aromatic amino moiety through a spacer group, the length calculated for these ranges is half the actual length of these bifunctional molecules, non-limiting examples of these are as listed above. Although not bound by theory it is believed that these molecular lengths are particularly preferred for capping pore sizes in porous $SiO_2$ which have a diameter from about 10 to about 20 Å.

In another one embodiment of this, of the above described of Novel Aromatic Amino Functional Siloxanes, preferred ones are one which have as spacer length between the head and tail group ranging from about 10 Å to about 30 Å. In another embodiment it is particularly preferred if this range is about 12 Å to about 26 Å. Although not bound by theory it is believed that these spacer lengths are particularly preferred for capping pore sizes in porous $SiO_2$ which have a diameter from about 10 to about 20 Å.

Novel Compositions Containing Aromatic-Amino Functional Siloxanes

Another aspect of this invention is a novel composition comprised of any of the above described novel aromatic-amino functional siloxanes and an organic solvent containing a trace of water and an organic nonmetallic basic compound having a $pK_a$, as measured in water, from about 9 to about 15.7. In the above novel composition the organic solvents the solvent must contain a trace of water to allow for hydrolysis and oligomerization reactions of the above novel aromatic-amino functional siloxanes. An example of a suitable range would be one which would range from about 0.25 to about 2.5 wt % water in another embodiment from about 0.5 to about 2.5 wt %. This said, amount higher or lower than this range are not precluded, as long as it allows in a given solvent for enough hydrolysis and oligomerization of the novel aromatic-amino functional siloxanes in the composition to occur without causing any particulates to precipitate from the composition's solution.

Examples of suitable organic solvents are as follows: Solvents useful in the present disclosure are ones selected from the group consisting of C1-C4 alcohols, C4-C8 ethers, C3-C6 ketones, C3-C6 esters, C1-C8 halogenated solvents, C3-C12-amides, C5-C12 cyclic amides, $C_2$-$C_8$ sulfoxides and mixtures thereof. Examples of C1-C4 alcohols include methanol, ethanol, 1-propanol, and 2-propanol. Examples of C4-C8 ethers include diethyl ether, dipropyl ether, dibutyl ether, methyl t-butyl ether, and tetrahydrofuran. Examples of C3-C6 ketones include acetone, methyl ethyl ketone and cyclohexanone. Examples of C3-C6 esters include methyl acetate, ethyl acetate and n-butyl acetate. Examples of C1-C8 halogenated solvent include methylene chloride chloroform. Examples of C3-C12 amides and C5-C12 cyclic amides- are dimethylformamide and N-methyl-pyrrolidone, N-butyl-pyrrolidone. Examples of C2-C8 sulfoxide are dimethyl sulfoxide, and diethyl sulfoxide.

More specific examples of suitable organic solvents include ketones such as acetone, methyl ethyl ketone, cyclohexanone, methyl isoamyl ketone, methyl amyl ketone, and the like, polyhydric alcohols and derivatives thereof such as monomethyl, monoethyl, monopropyl, monobutyl and monophenyl ethers of ethyleneglycol, ethyleneglycol monoacetate, diethyleneglycol, diethyleneglycol monoacetate, propyleneglycol, propyleneglycol monoacetate, dipropyleneglycol or dipropyleneglycol monoacetate and the like, cyclic ethers such as dioxane, tetrahydrofuran and the like, esters such as methyl lactate, ethyl lactate, methyl acetate, ethyl acetate, butyl acetate and the like and solvents having aromatic groups such as anisole, ethyl benzene, xylenes, chlorobenzene, toluene and the like.

Other examples of suitable solvents are, glycol ethers such as ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, propylene glycol n-propyl ether, propylene glycol t-butyl ether, propylene glycol n-butyl ether, dipropylene glycol methyl ether, dipropylene glycol n-propyl ether, dipropylene glycol t-butyl ether, dipropylene glycol n-butyl ether, tripropylene glycol n-propyl ether, tripropylene glycol t-butyl ether, tripropylene glycol n-butyl ether, ethyl cellosolve, methyl cellosolve, polyethylene glycol monomethyl ether, polypropylene glycol monomethyl ether, methoxytriglycol, ethoxytriglycol, butoxytriglycol, 1-butoxyethoxy-2-propanol, and any combination thereof, including ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, and any combination thereof, can be used.

More specific examples of suitable solvent are propyleneglycol monomethyl ether acetate, propylene glycol monomethyl ether and ethyl lactate.

In one embodiment propylene glycol monomethyl ether (1-methoxypropan-2-yl acetate) (PGMEA) is employed.

The organic solvent described above may be used singly or in admixture according to need.

The component in the above novel composition comprising a "an organic nonmetallic basic compound having a $pK_a$ in water from about 9 to about 15.7," (NMBC) is selected from not only ones which not do not contain metallic elements which are known semiconductor IC device contaminants (Na, K, Cu and the like), but also excludes nonmetallic or metalloid components which are also known semiconductor IC device contaminants (P, As, B and the like).

Non limiting examples of suitable NMBC materials are amines, organic ammonium hydroxides, and ammonium aryloxides (aryl-O⁻) bases as follows:

Amines having a $pK_a$ from about 9 to about 15.7 such as alkylamines, dialkyl amines, trialkyl amines, this denotation also includes, branched, and cyclic saturated aliphatic amines either when the amine nitrogen is within the cycle or external to it; this denotation also further includes amines that have more than one amino functionality.

Non-limiting examples, are n-butylamine, dibutylamine, tributylamine, triethylamine, tripropylamine, dipropylamine, diethyl,butylamine (N,N-diethylbutan-1-amine) piperidine, 1-methylpiperidine, cyclohexylamine (cyclohexanamine), and propane-1,3-diamine, and the like.

Alkyl amines containing benzyl or other alkylaryl moieties in which a alkylene moiety is present between the nitrogen atom and the aryl moiety, allowing for a higher $pK_a$ such as the non-limiting examples of diethyl,benzylamine (N-benzyl-N-ethylethanamine), benzylamine (phenylmethamine), phenethylamine (phenethyl-$\lambda^1$-azane), ((2-naphthalen-1-yl)-ethyl)amine ((2-(napthathalene-1-yl)ethyl)-$\lambda^1$-azane), dimethyl,isopropylamine (N,N-dimethylpropan-2-amine).

The aforementioned amines may be substituted with other moieties which do not hinder their required $pK_a$ range such as aryl, alkyloxy, aryloxy and the like.

In one specific embodiment the amine is an alkyl amine having at least one alkyl group which has 4 carbons or more; a non-limiting embodiment of this aspect of the inventive composition is when the amine is n-butylamine.

Organic ammonium hydroxides (organic aminium hydroxides) having a $pK_a$ from about 9 to about 15.7, such as the hydroxide salts of tetraalkylammonium, trialkylammonium, dialkylammonium, alkylammonium (alkanaminium), and other ammonium cations which contain aryl moieties (phenyl, benzyl and the like) or mixtures of aryl moieties with alkyl moieties or mixtures of these quaternary ammonium hydroxide salts.

Specific non-limiting examples of Organic ammonium hydroxides are tetrabutylammonium hydroxide, tetrapropylammonium hydroxide, tetraethylammonium hydroxide, tetramethylammonium hydroxide, benzyldiethylammonium hydroxide (N-benzyl-N,N-diethylethanaminium) hydroxide. The aforementioned organic ammonium salts may be substituted with other moieties which do not hinder their required $pK_a$ range such as aryl and alkyl.

Organic aryloxides having a $pK_a$ from about 9 to about 15.7, such as aryloxides salts with tetraalkylammonium, trialkylammonium, dialkylammonium, alkylammonium (alkanaminium), and other ammonium cations which contain aryl moieties (phenyl, benzyl and the like) or mixtures of aryl moieties with alkyl moieties and the like, or mixtures of these quaternary ammonium hydroxide salts.

Specific non-limiting examples are tetrabutylammonium phenolate, tetrapropylammonium phenolate, tetraethylammonium hydroxide, tetramethylammonium phenolate, benzyldiethylammonium phenolate (N-benzyl-N,N-diethylethanaminium phenolate) tetrabutylammonium 2-naphtholate, tetrapropylammonium 2-naphtholate, tetraethylammonium 2-naphtholate, tetramethylammonium 2-naphtholate, benzyldiethylammonium 2-naphtholate (N-benzyl-N,N-diethylethanaminium naphthalen-1-olate) and the like, or mixtures of these. The aforementioned organic phenolate may be substituted with other moieties which do not hinder their required $pK_a$ range such as aryl and alkyl.

In any of the embodiments of the above novel compositions containing aromatic-amino functional siloxane compounds the solution may contain from about 0.5 to about 4 wt % of total solids (a.k.a aromatic-amino functional siloxane+NMBC) in the solution with the solvent component containing a trace of water. In another embodiment it may contain from about 0.75 to about 3 wt % solids in this solvent. In yet another embodiment it may contain from about 1 to about 2 wt % in this solvent.

In any of the embodiments of the above novel compositions containing aromatic-amino functional siloxane compounds the aromatic-amino functional siloxane and the NMBC these two component are present in a ratio aromatic-amino functional siloxane compounds In one embodiment of any of the above compositions, the molar ratio of aromatic-amino functional siloxane to NMBC ranges from about 0.333 to about 3.

In another embodiment of any of the above compositions, the molar ratio of aromatic-amino functional siloxane to NMBC ranges from about 0.5 to about 2.5.

In another embodiment of any of the above compositions, the molar ratio of aromatic-amino functional siloxane to NMBC ranges from about 0.75 to about 1.5.

In another embodiment of any of the above compositions, the molar ratio of aromatic-amino functional siloxane to NMBC ranges from about 0.90 to about 1.2.

In another embodiment of any of the above compositions, the molar ratio of aromatic-amino functional siloxane to NMBC ranges is about 1 to about 1.

Novel Compositions Containing Aromatic-Amino Functional Siloxanes Produce by Aging at Room Temperature In another embodiment any of the above novel compositions may be aged at about room temperature in the solution comprising the above described solvent containing a trace of water to produce an new novel composition is which part of the aromatic-amino functionalized siloxane has undergone hydrolysis and oligomerization to produce respectively hydrolyzed aromatic-amino functionalized siloxane containing Si—OH and aromatic-amino functionalized siloxane which have oligomerized through the formation of Si—O—Si moieties In one embodiment the solution composition is aged at about room temperature for about 1 day to about 4 weeks in order to partially hydrolyze (~10-12 mole %) and oligomerize the alkoxy silyl moieties in said compound.

In another embodiment the solution composition is aged at about room temperature for about 2 days to about 3 weeks in order to partially hydrolyze and oligomerize the alkoxy silyl moieties in said compound.

In another embodiment the solution composition is aged at about room temperature for about 3 days to about 3 weeks in order to partially hydrolyze and oligomerize the alkoxy silyl moieties in said compound.

In another embodiment the solution composition is aged at about room temperature for about 1 week to about 3 weeks in order to partially hydrolyze and oligomerize the alkoxy silyl moieties in said compound.

In another embodiment the solution composition is aged at about room temperature for about 2 weeks to about 3 weeks in order to partially hydrolyze and oligomerize the alkoxy silyl moieties in said compound.

In another embodiment the solution composition is aged at about room temperature for about 2 weeks in order to partially hydrolyze and oligomerize the alkoxy silyl moieties in said compound.

In another embodiment the solution composition is aged at about room temperature for about 3 weeks in order to partially hydrolyze and oligomerize the alkoxy silyl moieties in said compound.

In all embodiments aging these formulations, beyond 4 weeks does not cause any significant change in solution stability up to 1 year with no aggregation and precipitation. In term of performance in the formation of a SAM on a substrate in a period of 6 month to 1 year of aging there is a small change in film thickness of about 0.1 nm per two months which does not significantly affect the SAM's performance, for instance in applications where it is used as a barrier layer.

Controlled hydrolysis of Aromatic-Amino Functional Siloxanes as a 1 to 2 wt % solution in deuterated acetone leads to an estimate that the saturation point of hydrolysis of these materials is from about 10 mole % to about 12 mole %. Although not bound by theory, when hydrolysis occurs during deposition and self-assembly on the porous substrate it is believed that the hydrolysis has two components, a rapid solution hydrolysis and a slower bulk hydrolysis as the material deposits and self assembles on the porous substrate. The time required for hydrolysis/oligomerization to form self-assembled monolayers (SAM) with desired FT is governed by both. It is believed that concurrent with hydrolysis, a certain small amount of oligomerization is required to obtain the SAM on the porous substrate.

In another embodiment any of the above novel compositions may be aged at about room temperature in the solution comprising the above described solvent containing about 0.5 to about 2.5 wt % water; an organic nonmetallic basic compound having a p$K_a$ in water from about 9 to about 15.7.

In another embodiment any of the above novel an aged composition is produced by the following steps at about room temperature:

a1) combining any one of the novel compounds described above, a solvent containing about 0.5 to about 2.5 wt % water, and a nonmetallic basic compound having a p$K_a$ in water from about 9 to about 15.7;

b1) aging the solution at room temperature for about 2 to about 3 weeks to partially hydrolyze and oligomerize the alkoxy silyl moieties in said compound.

Novel Processes Employing the Novel Compositions Containing Aromatic-Amino Functional Siloxanes Produce by Aging at Room Temperature A process for forming a self-assembled monolayer on an unpatterned substrate comprising the steps:

a2) coating any one of the above described inventive compositions comprising an aromatic amino siloxane functionalized materials on a substrate to produce a coating b2) baking the coating at a temperature ranging from about 180 to about 220° C., under an inert gas, for about 10 to about 30 minutes to produce a baked film c2) rising the baked film with a solvent to remove un-grafted material leaving a self-assembled monolayer on the substrate.

A process for forming a self-assembled monolayer on a patterned dielectric substrate having a k value which ranges from about 2.2 to about 2.55, to cap pores in said patterned dielectric comprising the steps a3) coating any one of the above described inventive compositions comprising an aromatic amino siloxane functionalized materials on a patterned dielectric substrate to produce a coating on the patterned substrate b3) baking the coating on the patterned substrate at a temperature ranging from about 180 to about 220° C. under an inert gas, for about 10 to about 30 minutes to produce a baked film c3) rising said baked film with a solvent to produce a capped patterned dielectric, wherein a self-assembled monolayer on the surface of said patterned dielectric substrate, caps pores on said surface which have a diameter ranging from about 1 nm to about 2 nm.

In another aspect of the above process in step b3 the baking is at a temperate ranging from about 175 to about 200° C.

A process for copper metallization of a capped patterned dielectric substrate having a k value which ranges from about 2.2 to about 2.55 comprising the steps a4) coating a composition any one of the above described inventive composition comprising an aromatic amino siloxane functionalized materials on a patterned dielectric substrate to produce a coating on the patterned substrate b4) baking the coating on the patterned substrate at a temperature ranging from 180 to 220° C. under an inert gas, for 10 to 30 minutes to produce a baked film c4) rising said baked film with a solvent to produce a capped patterned dielectric, wherein a self-assembled monolayer on the surface of said patterned dielectric substrate, caps pores on said surface which have a diameter ranging from about 10 nm to about 20 Å;

d4) depositing on said capped patterned dielectric a layer of metal using atomic layer deposition.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Synthesis of Aromatic-Amino Functional Siloxane

Synthesis of Bipyridine Containing Siloxanes

These examples demonstrates synthesis of ω-halo-α-siloxy alkane (Scheme 1).

Scheme 1: Hydrosilylation of 8-bromo octane with triethoxysilane

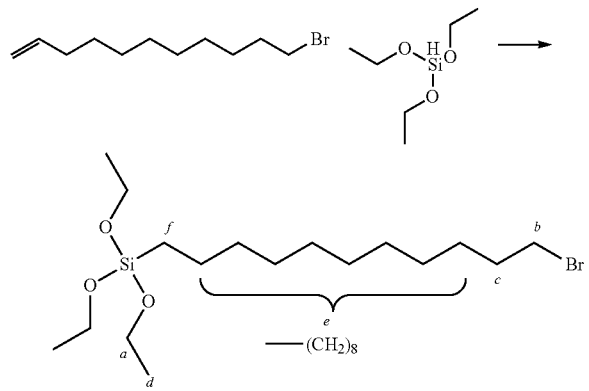

Example 1: Synthesis of (11-bromoundecyl) triethoxysilane 100 mmol of 11-bromo1-undecene and 102 mmol of triethoxy silane were added to a single neck round bottomed flask (RBF) attached with an attached reflux condenser. Then 1.0 mL Karstedt's catalyst (2 Wt. % solution in toluene, 0.1 mmol)) was added via syringe, after cessation of exothermic reaction, flask was in the oil bath between 80° C. for 1 h. $^1$H NMR of the crude mixture showed a complete consumption of chain end olefin groups, however, a close examination of the spectrum showed presence of ~15-20% olefin rearrangement products. Separation of desired (11-bromoundecyl) triethoxysilane was achieved through column chromatography on silica using 20% ethyl acetate hexane. Yield 47.6%.

Example 2: Synthesis of (11-bromoundecyl) triethoxysilane 86 mmol of 11-bromo1-undecene and 91 mmol of triethoxy silane were added to a single neck RBF attached with an attached reflux condenser. Then 1.0 mL Karstedt's catalyst (2 Wt. % solution in toluene, 0.1 mmol)) was added via syringe and flask was in the oil bath between 70° C. for 2 h. $^1$H NMR of the crude mixture showed a complete consumption of chain end olefin groups, however, a close examination of the spectrum showed presence of ~15-20% olefin rearrangement products. Separation of (11-bromoundecyl) triethoxysilane from rearrangement olefin and excess triethoxy silane was achieved by fractional distillation under high vacuum (Yield 67%).

Example 3: Synthesis of (8-bromooctyl) triethoxysilane 133 mmol of 11-bromo1-undecene and 136 mmol of triethoxy silane were added to a single neck RBF attached with an attached reflux condenser. Then 1.0 mL Karstedt's catalyst (2 Wt. % solution in toluene, 0.1 mmol)) was added via syringe and flask was in the oil bath between 70° C. for 2 h. Separation of (8-bromooctyl) triethoxysilane from rearrangement olefin and excess triethoxy silane was achieved by fractional distillation under high vacuum (BP. 170° C. at $10^{-6}$ mm). Yield 53.3%. FIG. 1 shows the $^1$H NMR spectrum of (8-bromooctyl) triethoxysilane.

Example 4: Synthesis of (8-bromooctyl)(ethoxy)dimethylsilane 266.8 mmol of 8-bromo1-octene and 345.4 mmol of dimethylethoxy silane were added to a single neck RBF attached with an attached reflux condenser. Then 1.0 mL Karstedt's catalyst (2 Wt. % solution in toluene and stirred at 70° C. for 2 h. Fractional distillation under high vacuum (BP. 120° C. at $10^{-6}$ mm) gave 61.0 g (Yield 79.7%).

Synthesis of Bipyridine Containing Siloxanes

These example demonstrates synthesis of siloxy-bipyridine derivatives (Scheme 2).

Scheme 2: Transmetallation of 4,4' dimethyl bipyridine with haloalkyl triethylsilane

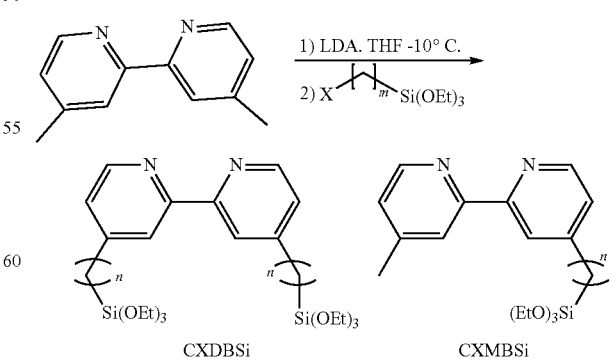

(n = m + 1)

Example 5a: Transmetallation of 4,4'dimethyl bipyridine with (11-bromoundecyl) triethoxysilane using LDA to make 4-methyl-4'-(12-(triethoxysilyl)dodecyl)-2,2'-bipyridine

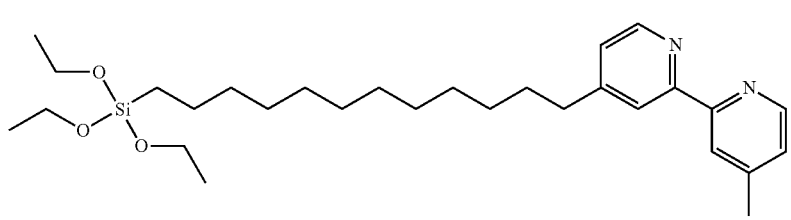

Figure 2:
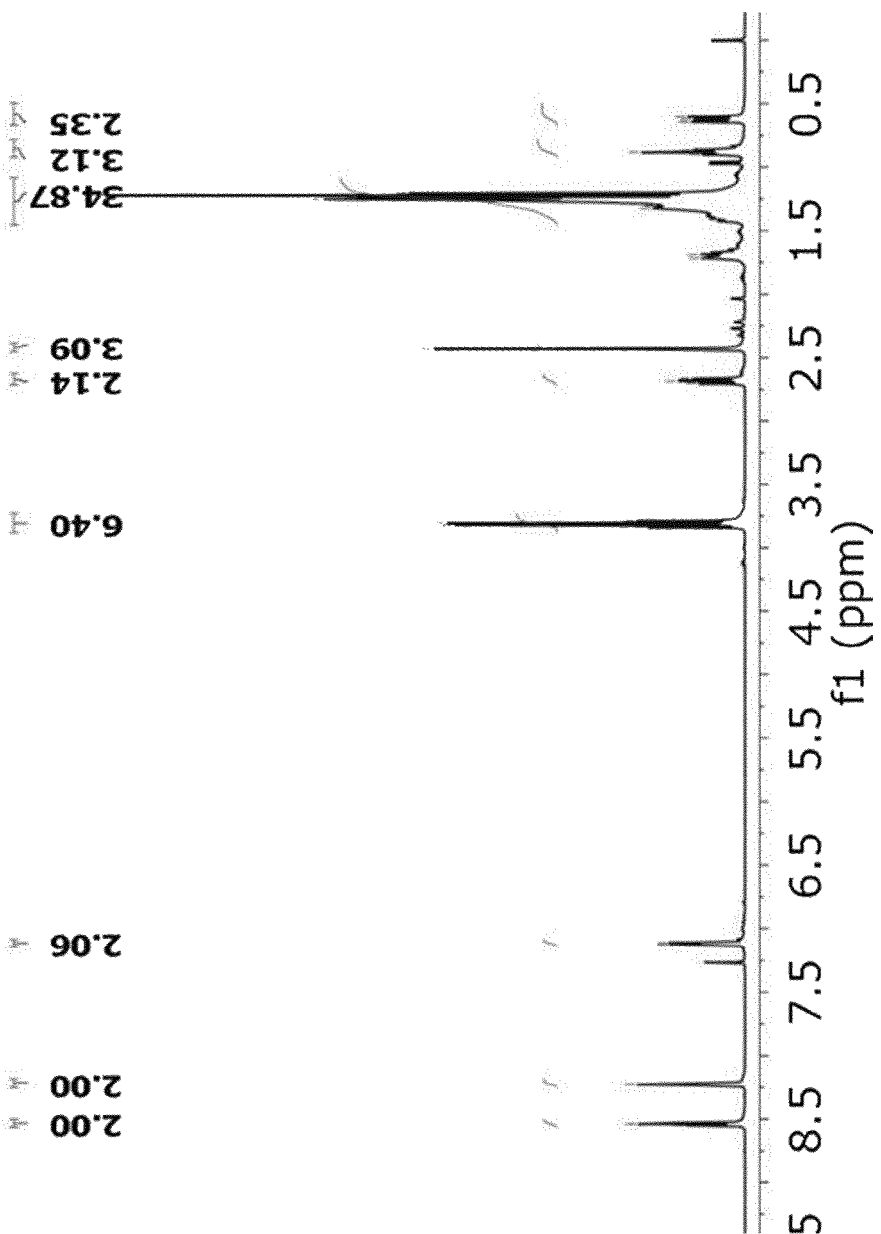
FIG. 2 $^1$H NMR spectrum of 4-methyl-4'-(12-(triethoxysilyl)dodecyl)-2,2'-bipyridine.

To a single neck RBF attached with a three way septum adaptor, was added 8.4 g of 4.4 dimethyl bipyridine (45.6 mmol). After drying under high vacuum for 10 min, flask was filled with argon and ~400 mL of dry THF was cannula transferred. A clear solution in the flask was cooled with ice water bath. Then, 25 mL of 2 M LDA (50.0 mmol) was added via cannula under argon, changing color to dark reddish brown. Obtained dark solution was kept under stirring for 1 h, then 18.2 g of (11-bromoundecyl) triethoxysilane (45.8 mmol) silane dissolved in 25 mL dry THF and degassed with argon purge for 5 min was added. Solution left to stir at ice bath temperature for 1 h, and then brought to room temperature and then stirred overnight. Upon removal of solvent on the roto-evaporators under reduced pressure, a viscous glue mass was obtained which was loaded on silica column and desired siloxy-bipyridine derivatives was eluted with 20% ethyl acetate:80% hexane mixture as colorless liquid. Yield 9.9 g (63.9%). FIG. 2 shows the ¹H NMR spectrum of 4-methyl-4'-(12-(triethoxysilyl)dodecyl)-2,2'-bipyridine.

Figure 3:
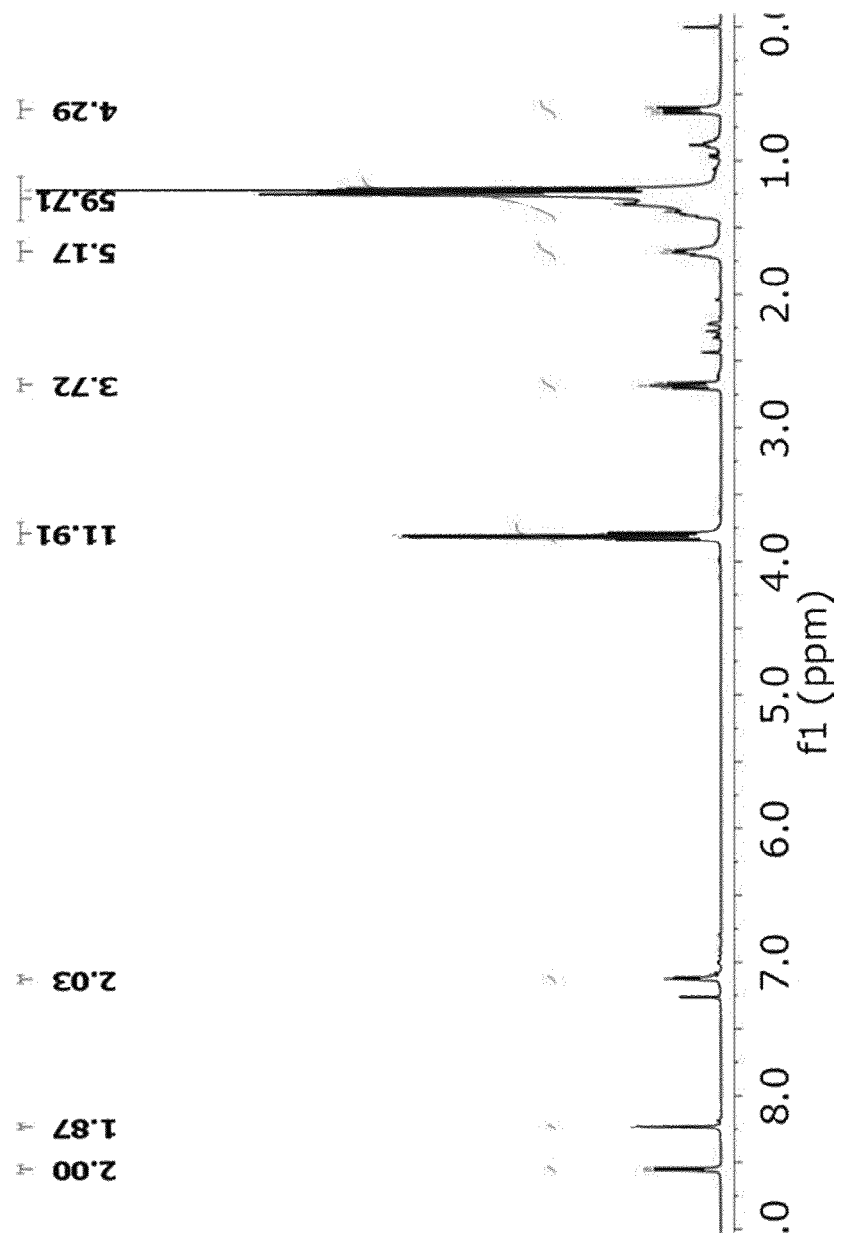
FIG. 3 $^1$H NMR spectrum of 4,4'-bis(12-(triethoxysilyl)dodecyl)-2,2'-bipyridine FIG. 4 AFM height image of Self-Assembled Monolayers (SAM) of C9MBSi on Si/SiO2 substrate (bake at 200° C. under $N_2$ for 20 min)

Example 5b: Transmetallation of 4,4'dimethyl bipyridine with (11-bromoundecyl) triethoxysilane using LDA to make 4,4'-bis(12-(triethoxysilyl)dodecyl)-2,2'-bipyridine Although, it can be synthesize separately (using 1:2 ratio) as described for C9DBSI, this compound was obtained as side product from the synthesis of C12MBSi. FIG. 3 shows the ¹H NMR spectrum of 4,4'-bis(12-(triethoxysilyl)dodecyl)-2,2'-bipyridine [4,4'-bis(12-(triethoxysilyl)dodecyl)-2,2'-bipyridine].

Example 6: Transmetallation of 4,4'dimethyl bipyridine with (8-bromooctyl) triethoxysilane using LDA to make 4-methyl-4'-(9-(triethoxysilyl)nonyl)-2,2'-bipyridine

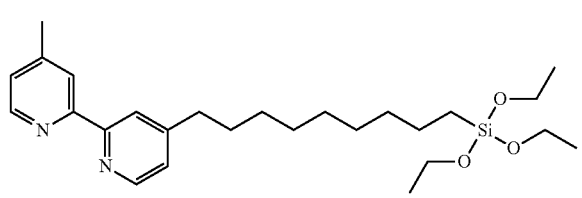

To a single neck RBF attached with a three way septum adaptor, was added 8.2 g of 4.4 dimethyl bipyridine (44.5 mmol). After drying under high vacuum for 10 min, flask was filled with argon and ~500 mL of dry THF was cannula transferred. A clear solution in the flask was cooled with ice

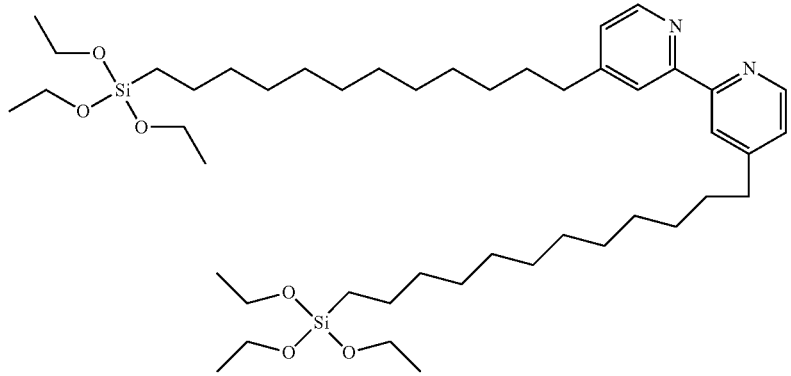

water bath. Then, 25 mL of 2 M LDA (50.0 mmol) was added via cannula under argon, changing color to dark reddish brown. Obtained dark solution was kept under stirring for 1 h, then 20.0 g of (56.27 mmol) 8-bromo 1-triethoxy silane dissolved in 25 mL dry THF and degassed with argon purge for 5 min was added. Solution left to stir at ice bath temperature for 1 h, and then brought to room temperature and then stirred overnight. Next day, THF was removed on roto-evaporator under reduced pressure, obtained viscous glue mass was loaded on silica column and desired siloxy-bipyridine derivatives was eluted with 20% ethyl acetate:80% hexane mixture as colorless liquid. Yield, 9.7 g monofunctional, 6.3 g mixture with ~10% difunctional (total yield=78.5%).

Example 7: Transmetallation of 4,4'dimethyl bipyridine with (8-bromooctyl) triethoxysilane using LDA to make 4,4'-bis(9-(triethoxysilyl)nonyl)-2,2'-bipyridine (C9DBSi)

To a single neck RBF attached with a three way septum adaptor, was added 4.2 g of 4.4 dimethyl bipyridine (40 mmol). After drying under high vacuum for 10 min, flask was filled with argon and ~500 mL of dry THF was cannula transferred. A clear solution in the flask was cooled with ice water bath. Then, 25 mL of 2 M LDA (50.0 mmol) was added via cannula under argon, changing color to dark reddish brown. Obtained dark solution was kept under stirring for 1 h, then 20.0 g of (56.3 mmol) 8-bromo 1-triethoxy silane dissolved in 25 mL dry THF and degassed with argon purge for 5 min was added. Solution left to stir at ice bath temperature for 1 h, and then brought to room temperature and then stirred overnight. Next day, THF was removed on roto-evaporator under reduced pressure, obtained viscous glue mass was loaded on silica column and separated to yield difunctional siloxy derivatives 12 g (yield=73.6%).

added via cannula under argon, changing color to dark reddish brown. Obtained dark solution was kept under stirring for 1 h, then 30.0 g of (101 mmol) 8-bromooctyl) (ethoxy)dimethylsilane dissolved in 25 mL dry THF and degassed with argon purge for 5 min was added. Solution left to stir at ice bath temperature for 1 h, and then brought to room temperature and then stirred overnight. Next day, THF was removed on roto-evaporator under reduced pressure, obtained viscous glue mass was loaded on silica column and separated to yield 19.2 g (yield=51.9%) of desired compound.

(C9MBSi-A)

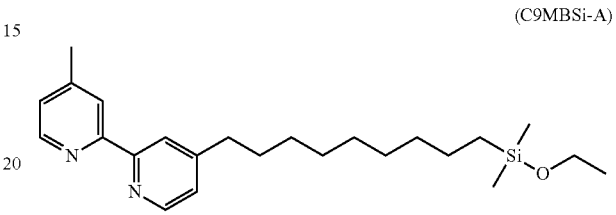

Synthesis of Hydroxyalkylsulfanyl derivatives of 1,10-phenantrolines

This section describes synthesis of Hydroxyalkylsulfanyl derivatives of 1,10-phenantrolines the procedure was adapted from the protocol described in Tetrahedron, 67, 2011, 7470-7478 for the 2-hydroxyethylsulfanyl derivative, however, the workup procedure employed herein is quite different. Scheme 3 shows the general synthesis pathway Hydroxyalkylsulfanyl derivatives of 1,10-phenantrolines.

Scheme 3: synthesis of Hydroxyalkylsulfanyl derivatives of 1,10-phenantrolines (C9DBSi)

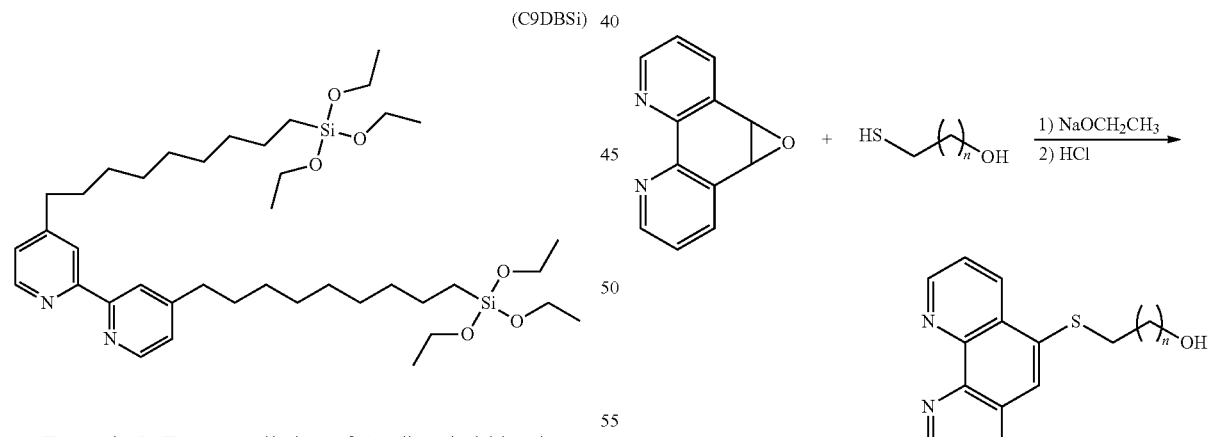

Example 8: Transmetallation of 4,4'dimethyl bipyridine with Synthesis of (8-bromooctyl)(ethoxy)dimethylsilane using LDA to make 4-(9-(ethoxydimethylsilyl)nonyl)-4'-methyl-2,2'-bipyridine (C9MBSi-A)

To a single neck RBF attached with a three way septum adaptor, was added 17.1 g of 4.4 dimethyl bipyridine (93 mmol). After drying under high vacuum for 10 min, flask was filled with argon and ~600 mL of dry THF was cannula transferred. A clear solution in the flask was cooled with ice water bath. Then, 50 mL of 2 M LDA (100.0 mmol) was Synthesis of alkylsulfanyl derivatives of 1,10-phenantrolines Example 9a: Synthesis of 2-((1,10-phenanthrolin-5-yl)thio)ethan-1-ol (I)

2-Mercaptoethanol (4.46 g, 57.1 m·mole) was slowly added to a sodium ethoxide solution (11.37 g, 35.1 m·mole as 21% ethanolic solution) in 100 ml of anhydrous ethanol. This mixture was spurge with Nitrogen for 30 min than added dropwise to the solution of 5,6-epoxy-5,6-dihydro-1,10-phenatroline (9.85 g, 50.2 m·mole) in 400 ml of anhydrous ethanol under Nitrogen and stirred for total of 21 hours at room temperature. The reaction mixture was neutralized with 20% HCl to pH 7 and the product was isolated by adding 1.750 L of water. The solid material was filtered under vacuum than suspended in water under stirring for several cycles. After drying in vacuum oven at 80° C. 12.3 g (92%) of the material I is bottled and used in the next step as it is. Mp 175-177° C. $^1$H NMR (CD$_3$OD): δ 3.24 (t, J=6.1 Hz, 2H; CH$_2$S), 3.84 (t, J=6.0 Hz, 2H; CH$_2$O), 7.58 (dd, J=8.1, 4.3 Hz, H8), 7.66 (dd, J=8.4, 4.3 Hz, H3), 7.85 (s, H6), 8.11 (dd, J=8.1, 1.7 Hz, H7), 8.76 (dd, J=8.3, 1.6 Hz, H4), 9.01 (dd, J=4.3, 1.7 Hz, H9), 9.17 (dd, J=4.3, 1.6 Hz, H2).

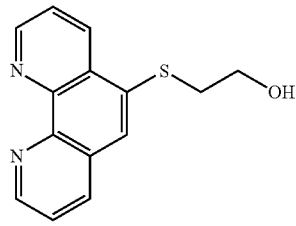
(I)

Example 9b: Synthesis of 8-((1,10-phenanthrolin-5-yl)thio)octan-1-ol (II)

8-Mercapto-1-octanol (2.20 g, 13.56 m·mole) was slowly added to a sodium ethoxide solution (2.66 g, 8.2 m·mole as 21% etanolic solution) in 11 g of anhydrous ethanol. This mixture was spurge with Nitrogen for 30 min than added dropwise to the solution of 5,6-epoxy-5,6-dihydro-1,10-phenatroline (2.54 g, 12.9 m·mole) in 56 ml of anhydrous ethanol under Nitrogen and stirred for total of 21 hours at room temperature. The reaction mixture was neutralized with 20% HCl to pH 7 and the product was isolated by adding ~750 ml of water. The solid material was filtered under vacuum than suspended in water under stirring for several cycles. After drying in vacuum oven at 80° C. 4.1 g (93%) of material II is bottled and used in the next step as it is. $^1$H NMR (CDCl$_3$): δ 1.73-1.30 (m, 12H; CH$_2$), 3.04 (t, J=7.3 Hz, 2H; CH$_2$S), 3.59 (t, J=6.6 Hz, 2H; CH$_2$O), 4.70 (bs, 1H; OH), 7.58 (dd, J=8.0, 4.3 Hz, H8), 7.65 (dd, J=8.3, 4.3 Hz, H3), 7.70 (s, H6), 8.11 (dd, J=8.1, 1.7 Hz, H7), 8.70 (dd, J=8.4, 1.6 Hz, H4), 9.10 (dd, J=4.3, 1.7 Hz, H9), 9.20 (dd, J=4.3, 1.6 Hz, H2).

(II)
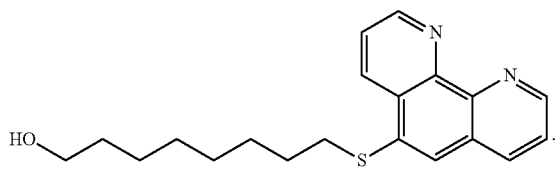

Synthesis 1,10 Phenanthroline Containing Siloxanes

These Examples demonstrate the synthesis of 1,10 phenanthroline containing siloxanes (Scheme 4).

Scheme 4: Synthesis 1,10 phenanthroline containing siloxanes

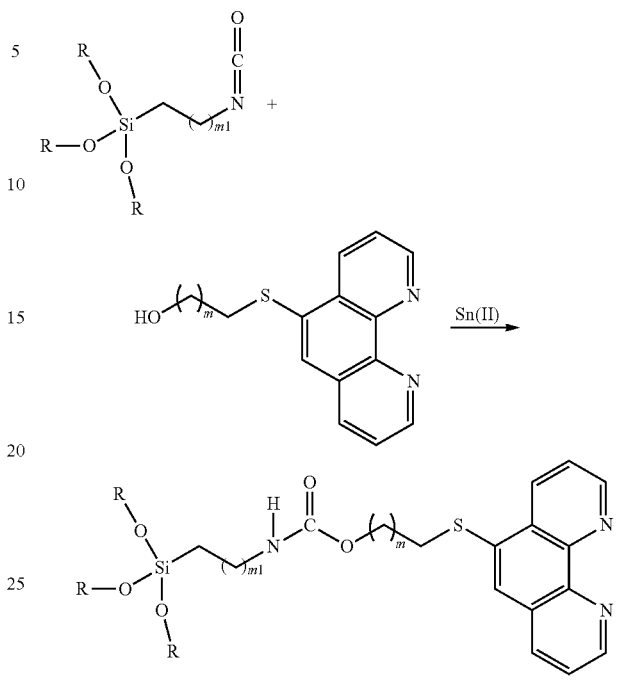

Example 10: 5-(2-(-3-(triethoxysilyl)propyl-carbamoyl-oxy)ethylsulfanyl)-1,10-phenantroline (III)

To the stirred suspension of 5-(2-hydroxyethyl-sulfanyl)-1,10-phenantroline (I) (3.93 g, 15.3 m·mole) with 3-isocyanatopropyltriethoxysilane (4.25 g, 17.2 m·mole) in 60 ml of anhydrous CCl4, three drops of Sn(II) catalyst was added and reaction crude was stirred overnight at room temperature. The solvent was removed from clear solution on rotary evaporator. The solid material was subjected to hexane extraction on roller for 5 times at room temperatures. After drying in vacuum oven at 40° C. g 7.16 g (93%) of the yellowish pure material with mp 98-100° C. has been obtained. It was used in the next step as it is. $^1$H NMR (CDCl$_3$): δ 0.59 (bt, J=8.0 Hz, 2H; CH$_2$Si), 1.19 (t, J=7.0 Hz, 9H; CH3), 1.58 (m, 2H), 3.12 (q, J=13.1, 6.6 Hz; CH$_2$N), 3.27 (t, J=6.89 Hz; 2H, CH$_2$S), 3.78 (q, J=14.0, 7.0 Hz, 6H, SiOCH$_2$), 4.28 (t, J=6.7 Hz; 2H, CH$_2$OC(O)), 4.88 (bs, 1H, NH), 7.64 (dd, J=8.3, 4.3 Hz, H8), 7.68 (dd, J=8.3, 4.3 Hz, H3), 7.94 (s, H6), 8.18 (dd, J=8.1, 1.5 Hz, H7), 8.76 (dd, J=8.3, 1.2 Hz, H4), 9.12 (dd, J=4.2, 1.5 Hz, H9), 9.16 (dd, J=4.2, 1.4 Hz, H2).

(III) (SAM1-2)
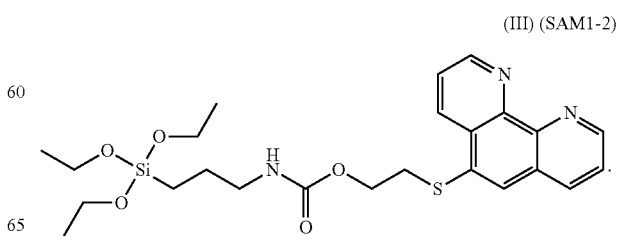

Example 11 Synthesis of 8-((1,10-phenanthrolin-5-yl)thio)octyl (3-(triethoxysilyl)propyl)carbamate (IV)

To the stirred suspension of 5-(2-hydroxyoctylsulfanyl)-1,10-phenantroline (I) (3.33 g, 9.79 m·mole) with 3-isocyanatopropyl triethoxysilane (2.50 g, 10.1 m·mole) in 35 ml of anhydrous CCl4, two drops of Sn(II) catalyst was added and reaction crude was stirred overnight at 38 C. The solvent was removed from clear solution on rotary evaporator. The solid material was subjected to hexane extraction on roller for 3 times at room temperatures. After drying in vacuum oven at 40° C. 5.5 g (93%) of the yellowish pure material with mp 86-88° C. has been obtained. It was used in the next step as it is. $^1$H NMR (CDCl$_3$): 1.19 (t, J=7.0 Hz, 9H; CH3), 1.33 (bs, 6H, CH$_2$), 1.47 (m, 2H; CH$_2$), 1.57 (m, 4H; CH$_2$), 1.72 (m, 2H; CH$_2$), 3.05 (t, J=7.3 Hz, CH$_2$S), 3.14 (bq, J=13.4, 6.6 Hz; 2H, CH$_2$N), 3.78 (q, J=14.0, 7.0 Hz, 6H, SiO CH$_2$), 3.99 (t, J=6.4 Hz; 2H, CH$_2$OC(O)), 4.84 (bs, 1H, NH), 7.59 (dd, J=8.1, 4.3 Hz, H8), 7.66 (dd, J=8.4, 4.3 Hz, H3), 7.71 (s, H6), 8.13 (dd, J=8.1, 1.6 Hz, H7), 8.74 (dd, J=8.3, 1.6 Hz, H4), 9.10 (dd, J=4.3, 1.6 Hz, H9), 9.19 (dd, J=4.3, 1.6 Hz, H2).

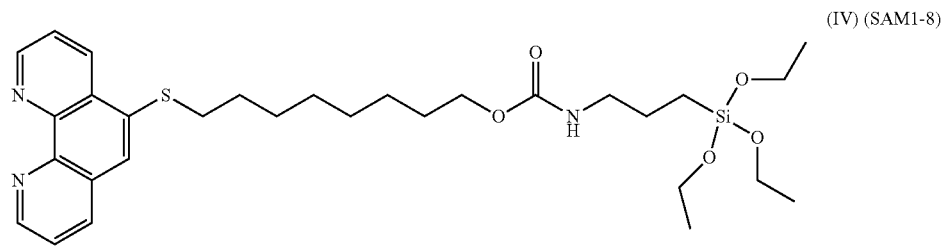 [SMILES: CCO[Si](CCCNC(=O)OCCCCCCCCSc1cc2cccnc2c2ncccc12)(OCC)OCC]

(IV) (SAM1-8)

Table 1 shows a summary of the above described SAM compounds and their characterization.

TABLE 1

Types of SAM compounds and their characterization

| Ex | Notation | Spacer | Solubility in PGMEA | % Purity $^1$H NMR | $T_d$ 5% (° C.) | # Bonds In Spacer | Theoridical. Spacer Length Å | Volume Cubic Å (half volume difunctional)** | Length Å (half Length difunctional)*** |
|---|---|---|---|---|---|---|---|---|---|
| 6 | C$_9$MBSi | L-A | Good | >95 | 250 | 9 | 12 | 421 | 14.7 |
| 7 | C$_9$DBSi | L-A | Good | >98 | 335 | 9 | 12 | 765 (382.5) | 39.6(19.8) |
| 5a | C$_{12}$MBSi | L-A | Good | >96 | 265 | 12 | 16 | 523 | 28.3 |
| 5b | C$_{12}$DBSi | L-A | Good | >98 | 348 | 12 | 16 | 856 (428) | 46.1(23.05) |
| 8 | C9MBSi-A | L-A | Good | >96 | 250 | 9 | 16 | 421 | 24.5 |
| 10 | SAM1-2 | H-A | Poor* | >95 | 250 | 10 | 18 | 451 | 21.8 |
| 11 | SAM1-8 | H-A | Poor* | >95 | 250 | 16 | 26 | 569 | 28.1 |

*Although these materials have poor solubility in PGMEA their solubility is good in stronger solvents such as chloroform, tetrahydrofuran, dimethylsulfoxide, dimethylformamide and the like.

**Volumes calculated with Molecular Modeling Pro Plus version 7.0.8 (Norgwyn Montgomery Software Inc.); bifunctional molecules such as C$_{12}$DBSi and C$_9$DBSi have the half volume value indicated in parenthesis.

***Length calculated with Molecular Modeling Pro Plus version 7.0.8 (Norgwyn Montgomery Software Inc.); bifunctional molecules such as C$_{12}$DBSi and C$_9$DBSi have the half-length value indicated in parenthesis.

Process for Self-Assembled Monolayers of Aromatic-Amino Functional Siloxane

Example 12: Processing with SAM of Unpatterned Substrates (Si/SiO$_2$) and Porous Patterned Dielectrics Compounds were dissolved in PGMEA in presence of equimolar n-butyl amine to make 1, 2 wt. % solutions. Solution was kept at RT and its stability and assembly behavior was analyzed as function of time. Assembly studies were performed on 1$_{1/2}$×1$_{1/2}$ inch coupon cut from a cleaned 8' Si wafer. Coupons were spin-coated with siloxy bipyridine derivatives using a spin-coating protocol consisting of hold time, and gradual increase in spin rate from 200-2500 rpm. Coupons were baked at temperature 200° C. for 20 min and rinsed with PGMEA. After rinsing coupon was further kept on the hot plate for 1 min to remove residual solvent for further studies. Coupons were analyzed for film thickness using ellipsometry and AFM for morphology. When coupon was spin-coated with freshly prepared solution, obtained thickness were less than the expected, however, desired thickness were obtained after 2-3 day aged solution. This was attributed to the hydrolysis of siloxy groups in presence of catalyst and residual water. Hydrolyzed silanol groups helps in formation of SAM.

Table 2 shows the thickness obtained after rinse of the layer before and after rinse, using, either 1 or a 2 wt % solution of C$_9$MBSi. This formulation hereafter referred as FORMULATION 1, and similar FORMULATION 2 formulation was made using example 8.

Figure 4:
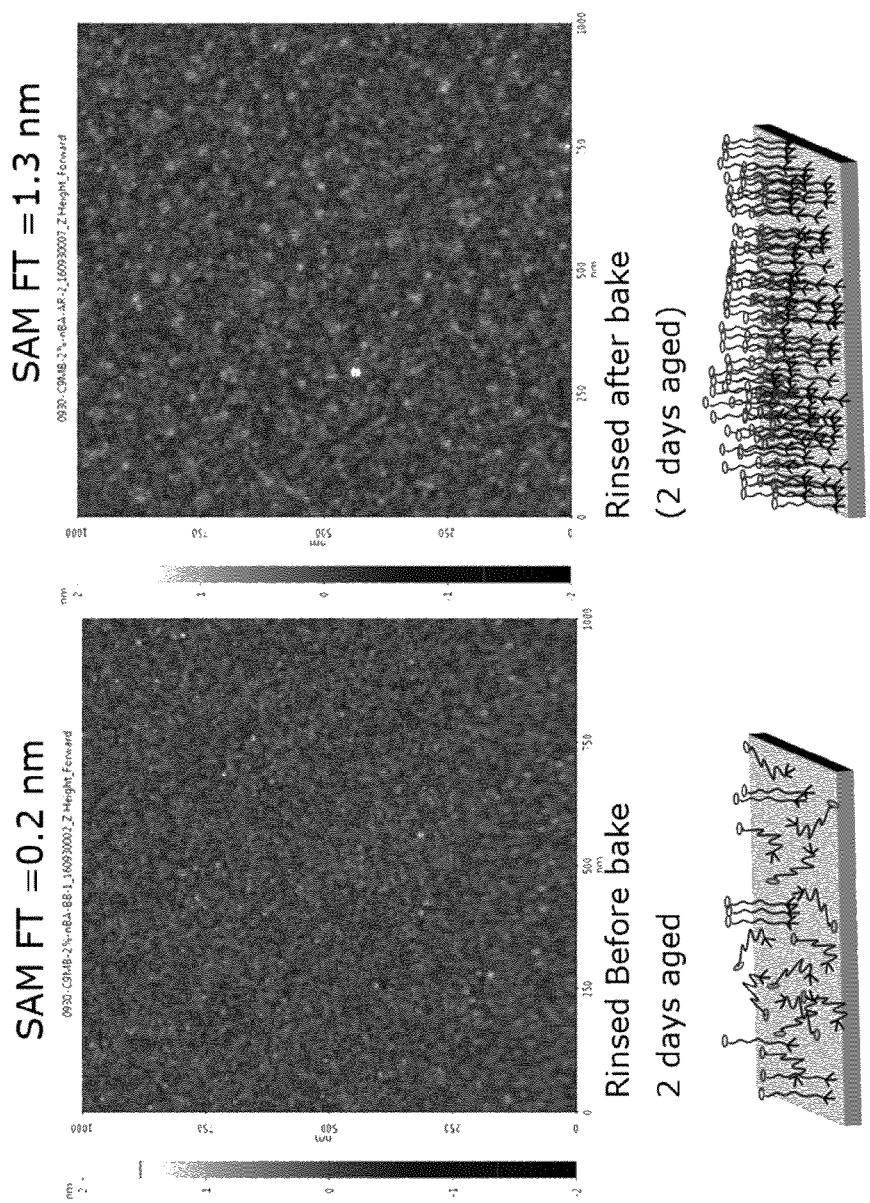

FIG. 4 shows an AFM height image of SAM of C9MBSi on Si/SiO$_2$ (bake at 200° C. under N$_2$ for 20 min).

TABLE 2

SAM thickness as a function of concentration

| SAN | Concentration Wt. % (C$_9$MBSi) | FT before Rinse (nm) | FT after rinse (nm) |
|---|---|---|---|
| Formulation 1 | 1 | 0.9 | 0.8 |
| Formulation 2 | 2 | 1.6 | 1.3 |

Process of Using Self-Assembled Monolayers of Aromatic-Amino Functional Siloxane The following Examples demonstrated the utility of the inventive SAM, and also demonstrated their unexpected properties.

Reaction of FORMULATION 1, and FORMULATION 2 with Metal Oxide Precursors

In order to characterize the SAM properties as barrier layers and also evaluate the role of bipyridine tails groups towards metal chelation, SAM's were treated with reactive metal oxide precursors using two different methods.

Example 13 Solution Reaction with Triethylaluminum

In the first method, reference and SAM coated substrates, coated with either Formulation 1 or Formulation 2, were treated with triethylaluminum. Manipulations were carried out in glovebox as follow: 1 mL of triethylaluminum (TEA) (25 wt % solution in toluene) was puddled on the 1.5×1.5 inch coupon for one minute and then rinsed with excess cyclohexane. After removing the coupons from the glovebox these immediately underwent hydrolysis on exposure to air. Next, the coupons were further washed under a stream of deionized water to hydrolyze deposited TEA and remove any physi-absorbed byproducts of TEA. Coupons were then further rinsed using PGMEA, and dried by heating at 110° C. for 2 min. Before TEA treatment XPS (X-ray photoelectron spectroscopy) analysis of SAM on Si-coupon showed higher at % (atomic %) values for C, and N and lower values for Si and O, which indicated formation of SAM on the Si surface (Table 3). Relative ratios of C/N for FORMULATION 1 and FORMULATION 2 found were 10 and 11, respectively. Si had small amounts of C, and N, which were due to environmental contamination, known to be associated with XPS.

TABLE 3

XPS atomic weight % composition for SAM on Si

| | Si | | FORMULATION 1C2 | | | FORMULATION 2C2 | | |
|---|---|---|---|---|---|---|---|---|
| Entry | At | % | C/N Ratio | At | % | C/N Ratio | At | % | C/N Ratio |
| 1 | C | 1.3 | 9.28 | C | 33.91 | 10.69 | C | 35.23 | 12.81 |
| 2 | N | 0.14 | | N | 3.17 | | N | 2.75 | |
| 3 | O | 30.3 | | O | 20.2 | | O | 18.40 | |
| 4 | Si | 58.1 | | Si | 34.53 | | Si | 35.20 | |

Importantly, the C/N ratio of FORMULATION 1 and FORMULATION 2 was higher than the theoretical values, indicating SAM formation on the surface of the coupons. Upon TEA treatment XPS analysis of all three coupons showed the presence of Al on the surface. As expected, Si showed high Al at % (Table 4), since TEA reacts with Si silanol groups and form relatively thick Si—Al-oxide layer. In theory, for densely packed alkyl SAM, in absence of silanol groups and reactive tail groups, it was hoped that the SAM would prevent diffusion of TEA to the surface, and no Al should be detected in XPS analysis. However, both FORMULATION 1 and FORMULATION 2 showed 1.3 and 0.5 at % Al.

TABLE 4

XPS atomic weight % composition after TEA treatment of SAM coated Si

| | Si-TEA | | FORMULATION 1C2-TEA | | FORMULATION 2C2-TEA | |
|---|---|---|---|---|---|---|
| Entry | At | % | At | % | At | % |
| 1 | C | 1.3 | C | 28.07 | C | 37.81 |
| 2 | N | 0.14 | N | 2.35 | N | 2.31 |
| 3 | O | 30.3 | O | 23.7 | O | 19.50 |
| 4 | Si | 58.1 | Si | 36.85 | Si | 3306 |
| 5 | Al | 3.7 | Al | 1.3 | Al | 0.5 |

These values were lower than the Si reference. Initial conclusions pointed to the hypothesis that FORMULATION 2 appeared to be acting as a better barrier to TEA; however, these values correlated well with the observed order and surface density of SAM, which was found to be higher for FORMULATION 1 than for FORMULATION 2. Surface bipyridine groups reacted with TEA and provided a nucleating site for Al-oxide, respectively. Under current experimental condition it is unexpected for Si/SAM to form a minimum single layer of Al—O. For a monolayer of aluminum oxide coordinated to FORMULATION 1 expected ratios of C/N and C/Al were 10 and 20 respectively. Whereas, obtained ratio were 12 and, 21 respectively (Table 5).

For FORMULATION 2 theoretical vs obtained ratios were 12 and 24, vs 16 and 78, respectively. These values indicated that the Formulation 1 produced SAM was densely packed and bipyridine groups were well organized which, in turn, led to better coordination with TEA and hence, resulted in equimolar Al—O values. Whereas, for samples prepared with FORMULATION 2, owing to its moderate density, the SAM was relatively unordered, hence it had few aromatic amino groups available to nucleate, and hence it resulted in lower Al contents at the surface. The above method was solution based, and limited further growth of metal oxide. Therefore, the Si/SAM coupons were subjected to the atomic layer deposition (ALD) to form a layer of metal oxide. For aluminum oxide growth a total five ALD cycles was used with precursor's trimethylaluminum (TMA) and water, and a substrate temperature of 200° C. It was clear that for these SAM coated substrates, both Si and various low-k substrates showed identical values of Al at % for FORMULATION 1 and FORMULATION 2, indicating that these SAM layer prevented diffusion of metal oxide to the surface of substrates and metal oxides grew only on the top of SAM (Table 6). These values were higher than those found with the solution based method. This was due to the multiple, subsequent, ALD cycles, where each layer acted as nucleating center. Relatively lower values for ALD deposition showed that for complete activation of surface groups, at least a few ALD cycles were needed.

Unexpectedly, SAM not only prevented diffusion of metal oxides to the surface, but also helped in the deposition of MO on top of SAM layer. Although not bound by theory this may be due to presence of aromatic amino tail-groups which can complex well with metals.

TABLE 5

XPS atomic weight % ratios before and after TEA treatment

|  | Si | | FORMULATION 1 | | FORMULATION 2 | |
| --- | --- | --- | --- | --- | --- | --- |
| Ratio | Neat | TEA treated | Neat | TEA Treated | Neat | TEA Treated |
| C/N $_{Th.}$ | n/a | n/a | 10 | 10 | 11 | 11 |
| C/N $_{Obs.}$ | n/a | n/a | 11 | 12 | 13 | 16 |
| C/Al $_{Th.}$ | 0 | n./a | 0 | 20 | 0 | 22 |
| C/Al $_{Obs.}$ | 0 | 3.7 | 0 | 21 | 0 | 78 |

TABLE 6

XPS atomic weight % for ALD coated $Al_2O_3$ on the of SAM treated substrates

| | | Si | | SOG 2.2 | | OSG 2.40 | | OSG 2.55 | |
| --- | --- | --- | --- | --- | --- | --- | --- | --- | --- |
| Entry | FORMULATION | C | Al | C | Al | C | Al | C | Al |
| 1) | Neat | 16.5 | 5.56 | 35.0 | 4.28 | 24.9 | 3.82 | 43.5 | 2.90 |
| 2) | FORMULATION-130 C2 | 37.7 | 2.15 | 59.6 | 1.75 | 66.3 | 1.76 | 65.9 | 1.75 |
| 2) | FORMULATION-530 C2 | 33.6 | 2.06 | 56.2 | 1.83 | 66.4 | 1.61 | 63.9 | 1.79 |

Example 14 ALD Reaction with Trimethylaluminum

Similarly, ALD was used to deposit a thin film of hafnium oxide by using precursor's tetrakis (dimethylamido) hafnium (IV) (TDMA Hf) for hafnium, and water for oxygen. The substrate temperature used was 200° C. and a total 35 ALD cycles were applied which grew a $HfO_2$ thin film of ~3.5 nm. Elemental compositions were calculated using XPS (Table 7). Small difference of Hf at % were noted between reference and FORMULATION 1 and FORMULATION 2. These results follow the same trends as was observed using ALD grown of $Al_2O_3$. This indicated that the first few ALD cycles took part in an activation of the surface, which can grow more MO, if it is subjected to more ALD cycles. Moreover, the SAM was stable up-to 35 ALD cycles, since there was no significant changes in the atomic composition of the surface observed after 35 cycles.

TABLE 7

XPS elemental at % composition for hafnium oxide film grown FORMULATION-SAM for Si substrate

| | Si Measurement Angle | | FORMULATION 1 Measurement Angle | | FORMULATION 2 Measurement Angle | |
| --- | --- | --- | --- | --- | --- | --- |
| At % | 90° | 45° | 90° | 45° | 90° | 45° |
| Hf | 20.9 | 21.2 | 16.5 | 17.1 | 17.3 | 22.4 |
| C | 12.8, 2.2 | 16.4, 2.6 | 18 | 21.4, 3.2 | 15.0 | 17.6 |
| N | 0 | 0 | 0 | 0 | 0 | 0 |
| O | 47.5, 8.5 | 45, 10 | 40, 10.5 | 42.7, 8.7 | 42.7, 10.1 | 44.5, 9.4 |
| Si | 6.5, 1.6 | 3.7, 1.2 | 9.7 3.0 | 4.9, 2.2 | 7.0, 1.9 | 4.0. 2.0 |

In summary, SAM formed by the inventive formulations comprised of the inventive aromatic-amino functional siloxane served dual purpose, effectively blocking penetration of MO to the substrate, wherein the tail group/ligands chelated metal precursors and helped to grow MO on top of SAM.

COMPARATIVE EXAMPLES

Two common methods used for the preparation of SAM's are dip-coating and vapor phase deposition. A few commonly used SAM precursors are shown in Table 8 compared these were dissolved in PGMEA as a 1 wt % solution containing an equimolar amount of n-butyl amine and compared to the inventive formulation (Formulations in Table 2) and it was found that these materials had problematic issues associated with their use as summarized in Table 8. Specifically, only the inventive composition containing the inventive aromatic-amino functional siloxane (e.g. Table 2) performed correctly to consistently form a SAM layer even after 4 weeks of aging. Other materials, are not properly spin coatable, forming visually non-uniform coating which are multilayers, but also, when dissolved in PGMEA formed unstable solution which quickly formed precipitates. Therefore, the inventive composition are not only the first report such materials, but also unexpectedly shows the property of being spin coatable, forming a self-assembled monolayer on a porous dielectric which can then acts as a barrier towards undesirable diffusion into the pores of metals oxide during deposition. Such diffusion, if not suppressed would lead to a degradation of the performance of the porous dielectric in microelectronic devices.

TABLE 8

Spin-coating ability of commercial SAM precursors

| SAM Precursor | Spin-Coatable | Comment |
| --- | --- | --- |
| 11-cyanoundecyltrichlorosilane | No | Multilayer, unstable solution |
| Octadecyltrichlorosilane | No | Multilayer, unstable solution |
| 3-aminopropyltriethoxysilane | No | Multilayer, unstable solution |
| 3-aminopropyltriethoxysilane-diethylamine | No | Multilayer, unstable solution |
| Formulations described in this invention (e.g. Table 2) | Yes | Monolayer, stable solution with controlled Film thickness up-to 6 months |

We claim:

1. A compound having structure (1a), wherein
   $X_{1a}$ is a head group which has structure (3); $X_{2a}$ is a tail group selected from the group consisting of structures (4), and (4a);
   ∿∿∿ represents a point of attachment;
   Q and Q1 are independently selected from hydrogen or an alkyl group; wherein m is a integer ranging from 2 to 8, wherein, r' is the number of tail groups attached to the head group, and is 1, and m1 and m2 are integers independently ranging from 2 to 8; y and y1 independently are 0, 1 or 2; and further wherein R and R1 are independently selected from a C1 to C6 alkyl group;

$$\left[ X_{2a} - (CH_2)_m \right]_{r'} - X_{1a} \quad (1a)$$

(3)

(4)

∿∿∿O—C(=O)—N(H)—(CH_2)_{m1}—SiQ_y(OR)_{3-y}

∿∿∿(CH_2)_{m2}—Si(Q_1)_{y1}(OR_1)_{(3-y'-1)}. (4a)

2. The compound of claim 1, wherein the tail group has structure (4).

3. The compound of claim 1, wherein the tail group has structure (4a).

4. A composition comprising:
   a compound of claim 1;
   a solvent containing about 0.5 to about 2.5 wt % water; and
   an organic nonmetallic basic compound having a $pK_a$ in water from about 9 to about 15.7.

5. A composition produced by the steps of
   a1) forming a solution by combining a compound of claim 1, a solvent containing about 0.5 to about 2.5 wt % water, and a nonmetallic basic compound having a $pK_a$ in water from about 9 to about 15.7; and
   b1) aging the solution at room temperature for about 2 to about 3 weeks to partially hydrolyze and oligomerize the alkoxy silyl moieties in said compound.

6. A process for forming a self-assembled monolayer on an unpatterned substrate comprising the steps
   a2) coating a composition of claim 5 on a substrate to produce a coating;
   b2) baking the coating at a temperature ranging from about 180 to about 220° C., under an inert gas, for about 10 to about 30 minutes to produce a baked film; and
   c2) rising the baked film with a solvent to remove un-grafted material leaving a self-assembled monolayer on the substrate.

7. A process for forming a self-assembled monolayer on a patterned porous dielectric substrate having a k value which ranges from about 2.2 to about 2.55, to cap pores in said patterned porous dielectric substrate comprising the steps
   a3) coating a composition of claim 5 on a surface of the patterned porous dielectric substrate to produce a coating on the patterned porous dielectric substrate;
   b3) baking the coating on the patterned porous dielectric substrate at a temperature ranging from about 180 to about 220° C. under an inert gas, for about 10 to about 30 minutes to produce a baked film; and
   c3) rising said baked film with a solvent to produce a capped patterned porous dielectric substrate, wherein the self-assembled monolayer on the surface of said capped patterned porous dielectric substrate, caps pores on said surface which have a diameter ranging from about 10 Å to about 20 Å.

8. The process of claim 6 wherein in the baking in step b3) is at a temperate ranging from about 175 to about 200° C.

9. A process for copper metallization of a capped patterned dielectric substrate having a k value which ranges from about 2.2 to about 2.55 comprising the steps
   a4) applying a composition of claim 5 on a surface of a patterned porous dielectric substrate to produce a coating on the patterned porous dielectric substrate;
   b4) baking the coating on the patterned porous dielectric substrate at a temperature ranging from 180 to 220° C. under an inert gas, for 10 to 30 minutes to produce a baked film;
   c4) rising said baked film with a solvent to produce a capped patterned porous dielectric substrate;
   wherein a self-assembled monolayer on the surface of said patterned porous dielectric substrate, caps pores on said surface which have a diameter ranging from about 1 nm to about 2 nm; and
   d4) depositing on said capped patterned porous dielectric substrate a layer of metal using atomic layer deposition.

* * * * *